US012621945B2

(12) United States Patent
Kim et al.

(10) Patent No.: US 12,621,945 B2
(45) Date of Patent: May 5, 2026

(54) MEASUREMENT AREA FOR FOLDING AREA AND FOLDABLE DISPLAY DEVICE HAVING THE SAME

(71) Applicant: Samsung Display Co., LTD., Yongin-si (KR)

(72) Inventors: Minseop Kim, Cheonan-si (KR); Yongkwon Soh, Hwaseong-si (KR); Junsu Lee, Namyangju-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 572 days.

(21) Appl. No.: 18/099,580

(22) Filed: Jan. 20, 2023

(65) Prior Publication Data

US 2023/0269895 A1      Aug. 24, 2023

(30) Foreign Application Priority Data

Feb. 21, 2022    (KR) ........................ 10-2022-0022384

(51) Int. Cl.
*H05K 5/03*              (2006.01)
(52) U.S. Cl.
CPC ..................................... *H05K 5/03* (2013.01)
(58) Field of Classification Search
CPC .. G06F 1/1641; G06F 1/1652; H04M 1/0214; H04M 1/0268; H05K 5/03; H10K 59/10; H10K 77/111; Y02E 10/549
See application file for complete search history.

(56) References Cited

U.S. PATENT DOCUMENTS

2021/0407344 A1    12/2021    Lee et al.

FOREIGN PATENT DOCUMENTS

| | | |
|---|---|---|
| KR | 100731604 B1 | 6/2007 |
| KR | 20180047603 A | 5/2018 |
| KR | 20220002005 A | 1/2022 |

OTHER PUBLICATIONS

Wu et al (CN 111324181) Jun. 23 (Year: 2020).*
Korean Office Action for Korean Patent Application No. 10-2022-0022384 dated Oct. 24, 2025.

* cited by examiner

*Primary Examiner* — Lawrence D Ferguson
(74) *Attorney, Agent, or Firm* — CANTOR COLBURN LLP

(57)                    ABSTRACT

A foldable display device includes a display panel which emits light toward a first surface of the display panel, and includes a folding area and a non-folding area which is adjacent to the folding area along a first direction, and a protective layer on a second surface opposite to the first surface, facing the folding area of the display panel and defining a plurality of concave portions corresponding to the folding area. Each of the plurality of concave portions extends along a second direction crossing the first direction and has a first width along the first direction, and concave portions adjacent to each other along the first direction among the plurality of concave portions, are connected to each other along the first direction.

25 Claims, 18 Drawing Sheets

1

MEASUREMENT AREA FOR FOLDING AREA AND FOLDABLE DISPLAY DEVICE HAVING THE SAME

This application claims priority to Korean Patent Application No. 10-2022-0022384, filed on Feb. 21, 2022, and all the benefits accruing therefrom under 35 U.S.C. § 119, the content of which in its entirety is herein incorporated by reference.

BACKGROUND

(1) Field

Implementations of the invention relate generally to a foldable display device displaying an image.

(2) Description Of The Related Art

A display device is manufactured and used in various ways. The display device may provide visual information to outside the display device, such as to a user, by emitting light. In order to emit light, the display device may include a light emitting material. For example, the display device may include a liquid crystal display that emits light using a liquid crystal layer, an inorganic light emitting display that emits light using an inorganic light emitting diode, and an organic light emitting display that emits light using an organic light emitting diode.

A display device configured to be deformed has been manufactured and used. For example, a foldable display device, a rollable display device, a bendable display device, etc. have been provided as a deformable display device.

SUMMARY

Using a material having relatively high rigidity in a foldable display device may make changing a shape of the foldable display device difficult. However, if the rigidity of the material of a foldable display device is weakened by forming a pattern on the material, to promote deformability of the material, the shape of the foldable display device including the material having relatively high rigidity may be easily changed.

Embodiments provide a foldable display device displaying an image.

A foldable display device according to an embodiment includes a display panel emitting light toward a first surface and including a first non-folding area, a folding area, and a second non-folding area spaced apart from the first non-folding area in a first direction by the folding area, and a protective layer on a second surface opposite to the first surface, and including a plurality of concave portions extending in a second direction perpendicular to the first direction in an area corresponding to the folding area. Each of the plurality of concave portions has a first width in the first direction, and some of the plurality of concave portions are connected to each other in the first direction.

In an embodiment, the protective layer may have a first thickness. The protective layer may have a second thickness in an area in which the plurality of concave portions is formed (or provided), where the second thickness is smaller than the first thickness. The protective layer may have the second thickness in a first area which the some concave portions are connected to each other in the first direction. Each of a second width of the first area in the first direction and the third width of the first area in the second direction is larger than the first width.

In an embodiment, others of the plurality of concave portions different from the some of the plurality of concave portions may be connected to each other in the first direction. The protective layer may have the second thickness in a second area which the others of the concave portions are connected to each other in the first direction. The second area may have the second width in the first direction and has the third width in the second direction.

In an embodiment, the protective layer may further include a measuring area in an area corresponding to at least one of the first non-folding area and the second non-folding area, and having the second thickness, where each of a fourth width of the measuring area in the first direction and a fifth width of the measuring area in the second direction is larger than the first width.

In an embodiment, others of the plurality of concave portions different from the some of the plurality of concave portions may be connected to each other in the first direction, and the protective layer may have the second thickness in a second area which the others of the concave portions are connected to each other in the first direction.

In an embodiment, the second area may be positioned spaced apart along the second direction, from the first area.

In an embodiment, the protective layer may include metal.

A foldable display device according to an embodiment includes a display panel emitting light toward a first surface and including a first non-folding area, a folding area, and a second non-folding area spaced apart from the first non-folding area in a first direction by the folding area, and a protective layer on a second surface opposite to the first surface and having a first thickness. The protective layer may include a plurality of concave portions having a second thickness smaller than the first thickness in an area corresponding to the folding area and extending in a second direction perpendicular to the first direction, and a measuring area having the second thickness in an area corresponding to at least one of the first non-folding area and the second non-folding area.

In an embodiment, each of a first width of the measuring area in the first direction and a second width of the measuring area in the second direction may be larger than a first width of the plurality of concave portions in the first direction.

A foldable display device according to an embodiment includes a substrate including a first non-folding area, folding area, and a second non-folding area spaced apart from the first non-folding area in a first direction by the folding area, and including a plurality of first concave portions, where the plurality of first concave portions extends in a second direction perpendicular to the first direction in an area corresponding to the folding area among a first surface, each of the first concave portions has a first width in the first direction, and some of the first concave portions are connected each other in the first direction, a plurality of driving parts on a second surface opposite to the first surface, and a plurality of light emitting elements connected to the plurality of driving parts.

In an embodiment, the substrate may have a first thickness. The substrate may have a second thickness in an area in which the plurality of concave portions is formed, where the second thickness is smaller than the first thickness. The substrate may have the second thickness in a first area which the some of the concave portions are connected to each other in the first direction. Each of a second width of the first area in the first direction and the third width of the first area in the second direction may be larger than the first width.

In an embodiment, others of the plurality of concave portions different from the some of the plurality of concave portions may be connected to each other in the first direction. The substrate may have the second thickness in a second area which the others of the concave portions are connected to each other in the first direction. The substrate may have the second width in the first direction and may have the third width in the second direction.

In an embodiment, the second area may be spaced apart in the second direction, from the first area.

In an embodiment, the substrate may further include a measuring area located in an area corresponding to at least one of the first non-folding area and the second non-folding area, and having the second thickness, where each of a fourth width of the measuring area in the first direction and a fifth width of the measuring area in the second direction is larger than the first width.

In an embodiment, others of the plurality of concave portions different from the some of the plurality of concave portions may be connected to each other in the first direction. The substrate may have the second thickness in a second area which the others of the concave portions are connected to each other in the first direction.

In an embodiment, the second area may be spaced apart in the second direction, from the first area.

In an embodiment, the substrate may include glass.

In an embodiment, the foldable display device may further include a protective layer on the first surface of the substrate, and including a plurality of second concave portions extending in the second direction in an area corresponding to the folding area.

In an embodiment, the protective layer may have a third thickness. The protective layer may have a fourth thickness in areas in which the plurality of second concave portions is formed, where the fourth thickness is smaller than the third thickness.

In an embodiment, some of the plurality of second concave portions may be connected to each other in the first direction. The protective layer may have the fourth thickness in a second area in which the some of the concave portions are connected to each other.

In an embodiment, others of the plurality of second concave portions different from the plurality of second concave portions may be connected to each other in the first direction. The protective layer has the fourth thickness in a third area in which the others of the concave portions may be connected to each other.

In an embodiment, the third area may be positioned in the second direction than the second area.

In an embodiment, the protective layer may further include a measuring area located in an area corresponding to at least one of the first non-folding area and the second non-folding area, and having the fourth thickness.

In an embodiment, the protective layer may include metal.

A foldable display device according to embodiments may include a folding area and a non-folding area. In an area corresponding to the folding area, a plurality of concave portions may be formed (or defined) in a substrate and/or a protective layer. At least part of the plurality of concave portions may be connected to each other. A width of an area at which the part of the plurality of concave portions are connected to each other may be larger than a width of the plurality of concave portions, to define a measuring concave portion. The substrate and/or a protective layer at the plurality of concave portions may have a same thickness as the area which the part of the plurality of concave portions are connected. To this end, even when the width of the plurality of concave portions is narrow, normal etching of the plurality of concave portions may be confirmed by measurement of a depth of the area in which the part of the concave portions are connected to each other (e.g., at a measuring concave portion).

A rigidity of the folding area may be reduced due to the plurality of concave portions in a support layer (e.g., the substrate and/or the protective layer). By connecting the part of the plurality of concave portions to each other within the folding area, the rigidity of the folding area may be further reduced. Accordingly, the foldable display device may be easily foldable at the folding area.

BRIEF DESCRIPTION OF THE DRAWINGS

The accompanying drawings, which are included to provide a further understanding of the invention and are incorporated in and constitute a part of this specification, illustrate embodiments of the invention together with the description.

DETAILED DESCRIPTION

Figure 1:
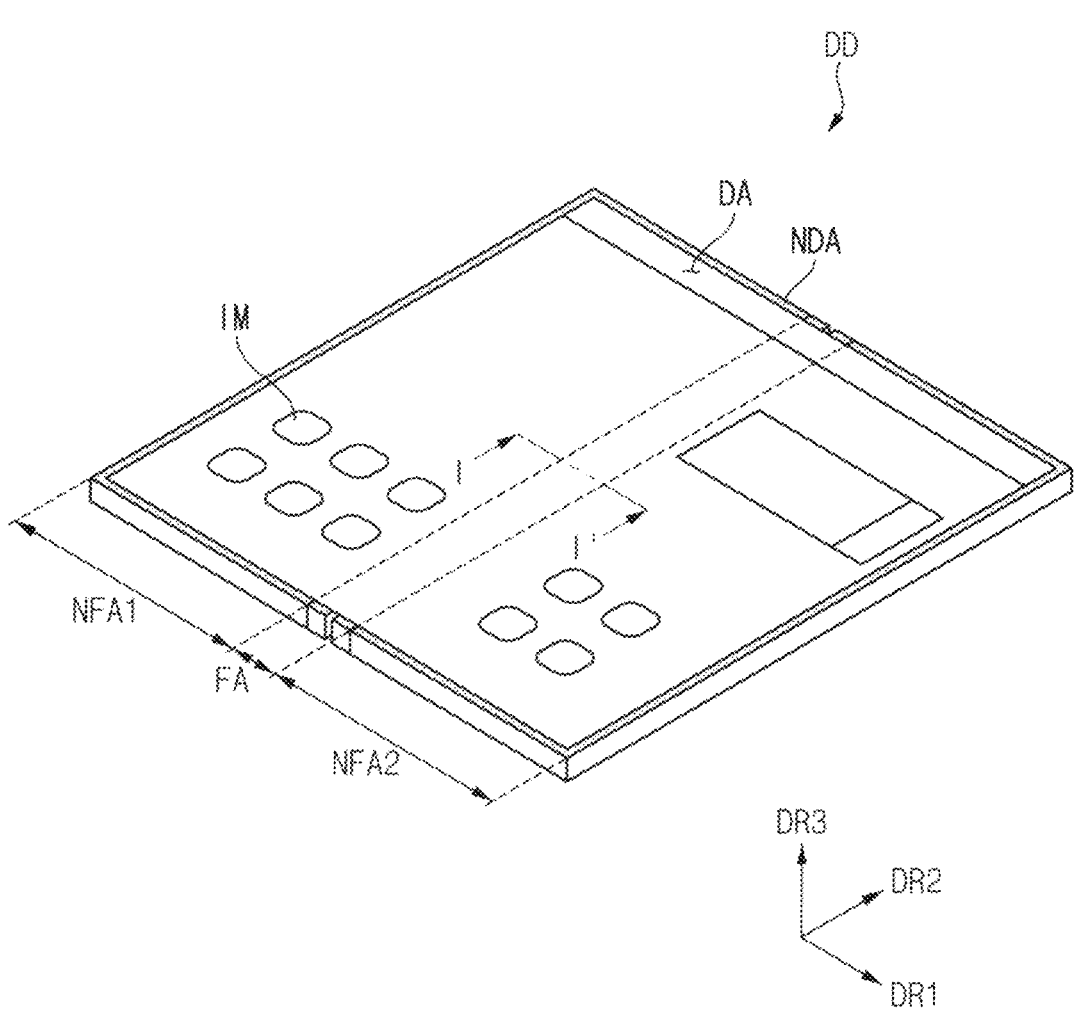
FIG. 1, FIG. 2, and FIG. 3 are diagrams illustrating a foldable display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Like reference numerals refer to like elements throughout. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to an element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

Figure 2:
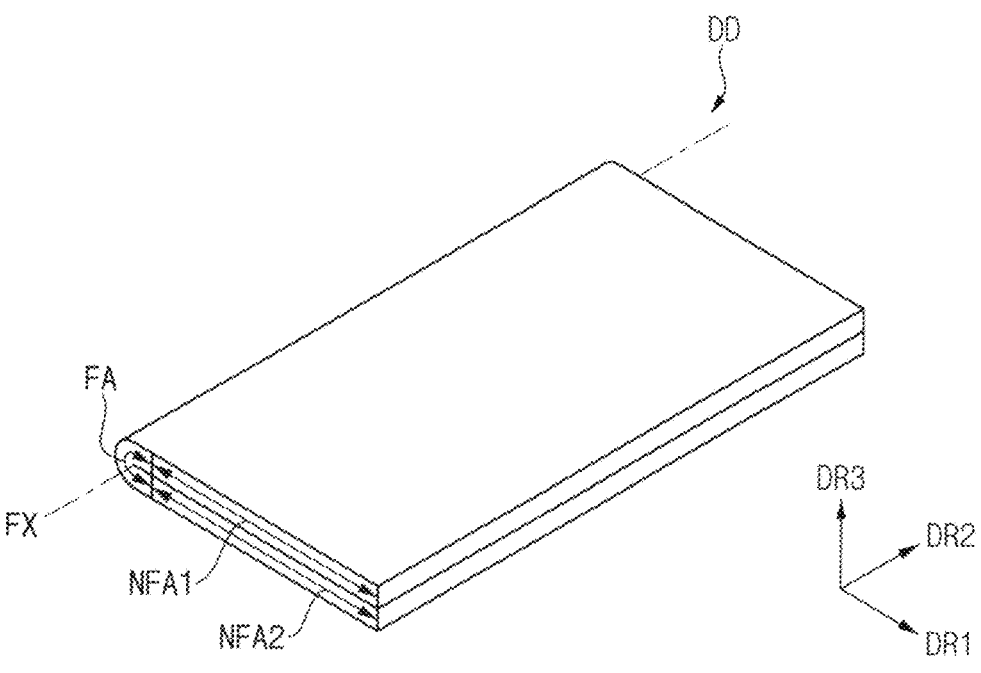
Figure 3:
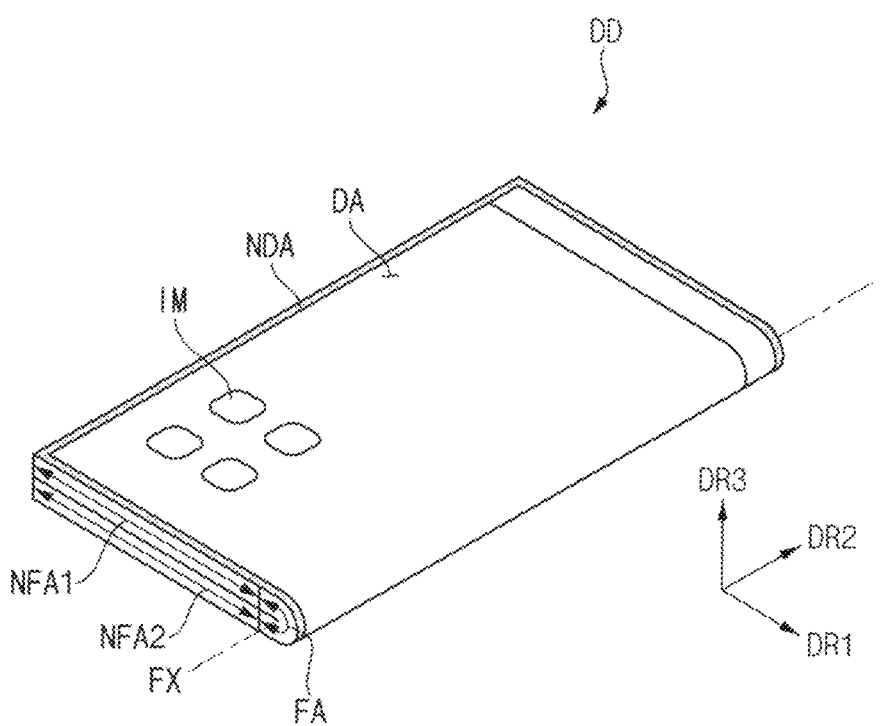

FIG. 1, FIG. 2, and FIG. 3 are diagrams illustrating a foldable display device DD according to an embodiment.

Referring to FIG. 1, a foldable display device DD may include a display area DA and a non-display area NDA. The foldable display device DD may display an image IM in a plane defined by a first direction DR1 and a second direction DR2 which crosses the first direction DR1, such as being perpendicular to the first direction DR1. In this case, the foldable display device DD may display the image IM in a third direction DR3 crossing, such as being perpendicular to, both the first direction DR1 and the second direction DR2. A thickness of the foldable display device DD and various components or layers thereof may be taken along the third direction DR3, to define a thickness direction. In FIG. 1, the foldable display device DD may be unfolded to be flat, e.g., disposed in a single plane defined by the first direction DR1 and the second direction DR2 crossing each other, without being limited thereto.

Pixels as a display element, may be disposed in the display area DA to generate and/or display the image IM, generate and/or emit light for displaying the image IM, etc. The pixels may be generally disposed in the display area DA. Each of the pixels may include driving elements and light emitting elements. The light emitting elements may be connected to the driving elements, and may emit light based on signals (e.g., electrical signals) transmitted from the driving elements.

Driving parts may be disposed in the non-display area NDA. The driving parts may be connected to the pixels, and may transmit signals to the pixels. The driving parts may include a data driving part, a gate driving part, a power voltage generator, a timing controller, etc.

The foldable display device DD may include a non-folding area provided in plural including a first non-folding area NFA1 and a second non-folding area NFA2, and a folding area FA, depending on a planar area at which the display device DD is foldable to be folded. The foldable display device DD may be folded at the folding area FA, such that the first non-folding area NFA1 and the second non-folding area NFA2 face each other based on the folding area FA. The foldable display device DD may be foldable about a folding axis FX. Various components or layers of the foldable display device DD may having a display area DA, a non-display area, a folding area FA, a non-folding area, etc. corresponding to those described above. Various components or layers may be foldable together with each other, at the folding area FA, without being limited thereto.

As shown in FIG. 2, the foldable display device DD may be in-folded based on a folding axis FX, so that surfaces displaying the image IM may be disposed to face each other. The folding area FA may be folded to have a curvature.

As shown in FIG. 3, the foldable display device DD may be out-folded based on a folding axis FX, so that the surface displaying the image IM may face in opposite directions to be visually recognized from outside of the foldable display device DD. The folding area FA may be folded to have a curvature.

In FIG. 2 and FIG. 3, examples in which the foldable display device DD is folded once is exemplified, but the foldable display device DD may be folded twice or more in (or at) two or more folding areas at which the foldable display device DD is foldable.

Figure 4:
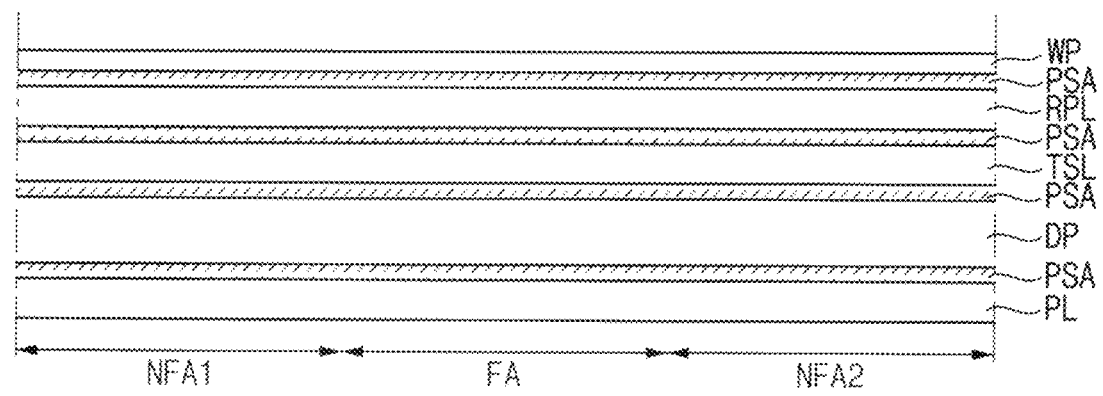
FIG. 4 is a cross-sectional view taken along a line I-I' of FIG. 1.
Figure 4:

FIG. 4 is a cross-sectional view taken along a line I-I' of FIG. 1.

Referring to FIG. 1 and FIG. 4, the foldable display device DD may include a protective layer PL, a display panel DP, a touch sensing layer TSL, an anti-reflection layer RPL, and a window part WP. Alternatively, the anti-reflection layer RPL may be excluded or replaced with another component. An adhesive layer PSA may be disposed between the above-described components. The adhesive layer PSA may connect the above-described components to each other. The adhesive layer PSA may be a pressure-sensitive adhesive film, a transparent adhesive film, etc.

The protective layer PL may protect the foldable display device DD from an impact applied from a lower surface of the foldable display device DD. To do this, the protective layer PL may include a material having rigidity or impact resistance higher than those of other components within the foldable display device DD. In addition, the protective layer PL may reflect light incident to the lower surface of the foldable display device DD. The protective layer PL may include a metal. Since the metal has rigidity, in order for the protective layer PL to be foldable at the folding area FA, a portion of the metal is not disposed on the folding area FA (e.g., may be excluded from the folding area FA). However, in this case, the folding area FA of various components or layers of the foldable display device DD may be exposed to an impact applied from the lower surface of the foldable display device DD or to light incident from the lower surface of the foldable display device DD. Accordingly, the protective layer PL may be patterned in the folding area FA. A patterned protective layer PL will be described with reference to figures to be described later.

The display panel DP may display the image IM by inclusion and driving of the pixels. The display panel DP may display an image IM by emitting light in a light emitting direction to a first surface (e.g., a display surface) positioned in the third direction DR3. The protective layer PL may be on a second surface (e.g., a rear surface) positioned in a direction opposite to the light emitting direction. The display panel DP will be described later.

The touch sensing layer TSL may recognize an external stimulus (for example, a contact, a pressure, a proximity, a light, etc. applied from an input tool such as user's touch). Although the touch sensing layer TSL is illustrated as being attached on the display panel DP by the adhesive layer PSA, the touch sensing layer TSL may be directly attached on the display panel DP without the adhesive layer PSA. As being directly attached or directly on, elements may form an interface therebetween, without being limited thereto.

The anti-reflection layer RPL may be attached on the touch sensing layer TSL by the adhesive layer PSA. The anti-reflection layer RPL may serve to reduce reflectance of external light incident on an upper surface of the window part WP.

The window part WP may be disposed at a top of the components included in the foldable display device DD, such as to define an uppermost layer along in third direction DR3. The window part WP may block impurities penetrating from outside (e.g., outside of the foldable display device DD), and may prevent an impact applied from outside from being transmitted to the components of the foldable display device DD.

Figure 5:
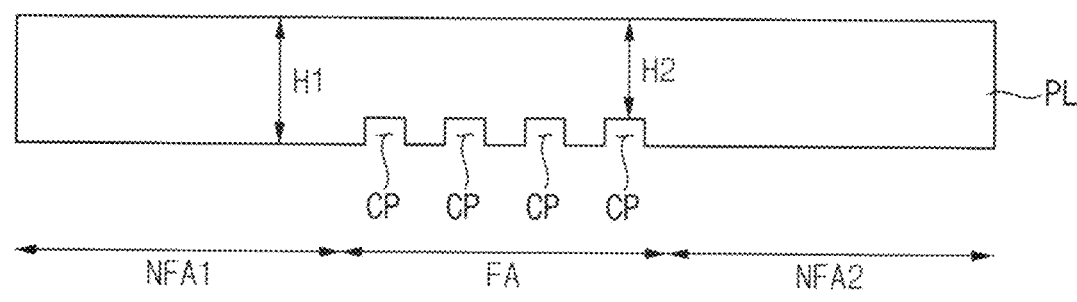
FIG. 5 and FIG. 6 are diagrams illustrating a protective layer included in the foldable display device of FIG. 1 according to an embodiment.
Figure 5:
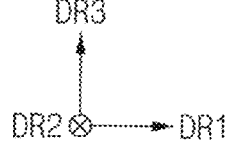
Figure 6:
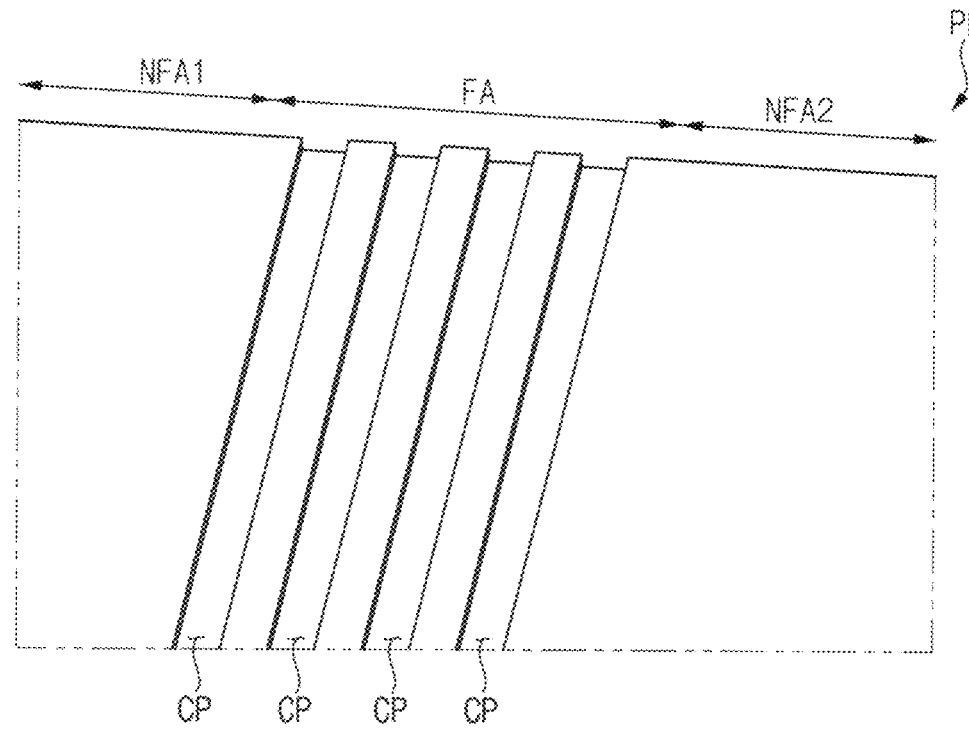

FIG. 5 and FIG. 6 are diagrams illustrating a protective layer PL included in the foldable display device DD of FIG. 1 according to an embodiment.

Referring to FIG. 5 and FIG. 6, the protective layer PL may include a concave portion CP provided in plural including a plurality of concave portions CP defined in the folding area FA. The plurality of concave portions CP may be spaced apart from each other in the first direction DR1, and may be extended in the second direction DR2. Each of the concave portions CP may be recessed from a lower surface of the protective layer PL which is furthest from the display panel DP, without being limited thereto. The concave portion CP may be open in a direction away from the display panel DP.

A thickness of the protective layer PL may vary according to areas thereof along the first direction DR1. The thickness of the protective layer PL may be defined as an height of the protective layer PL in the third direction DR3. Generally, the thickness of the protective layer PL may be a first height H1, and the first height H1 (or a first thickness) may define a maximum thickness of the protective layer PL. However, in an area of the protective layer PL respectively corresponding to the plurality of concave portions CP, the thickness of the protective layer PL may be a second height H2 (e.g., a second thickness) which is lower than the first height H1. Since the protective layer PL has a relatively thin thickness in the folding area FA, a rigidity of the protective layer PL in the folding area FA may be reduced. Accordingly, the folding area FA of the foldable display device DD may be easily folded.

The plurality of concave portions CP may be formed (or provided) to have a uniform depth in the third direction DR3. A measuring device including a measuring tip may be used to confirm whether the plurality of concave portions CP is formed to have a uniform depth. However, when a width of the plurality of concave portions CP in the first direction DR1 is reduced, it may be difficult to measure the depth of the plurality of concave portions CP.

Figure 7:
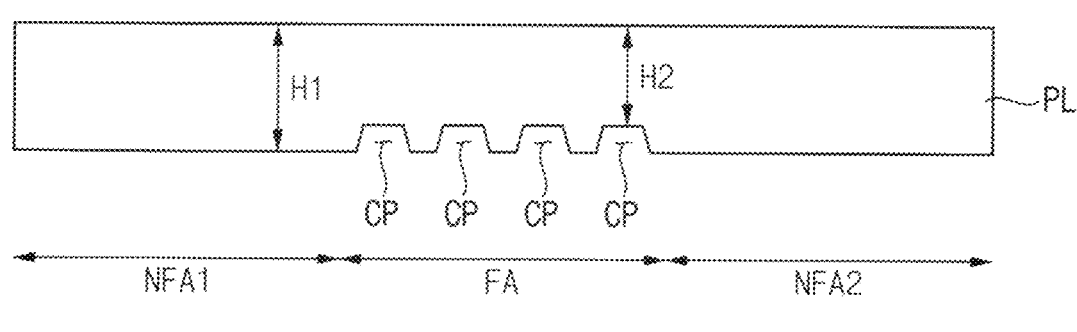
FIG. 7 is diagram illustrating a protective layer included in the foldable display device of FIG. 1 according to an embodiment.
Figure 7:
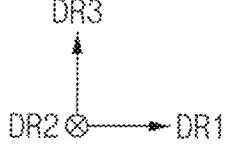

FIG. 7 is diagram illustrating a protective layer PL included in the foldable display device of FIG. 1 according to an embodiment.

Referring to FIG. 5 and FIG. 7, a shape of the plurality of concave portions CP may vary. For example, as shown in FIG. 5, the plurality of concave portions CP may be formed to have a rectangular shape in a cross-sectional view. Or, as shown in FIG. 7, the plurality of concave portions CP may be formed to have a trapezoidal shape in a cross-sectional view. However, these are exemplary. The plurality of concave portions CP may be formed to have various cross-sectional shapes.

Referring to FIG. 5 to FIG. 7, the plurality of concave portions CP may be disconnected to each other. A first thickness portion of the protective layer PL may be disposed between adjacent concave portions CP (e.g., adjacent second thickness portions) among the plurality of concave portions CP along the first direction DR1. The plurality of concave portions CP may be open at opposing sides of the protective layer PL along the second direction DR2, without being limited thereto.

Figure 8:
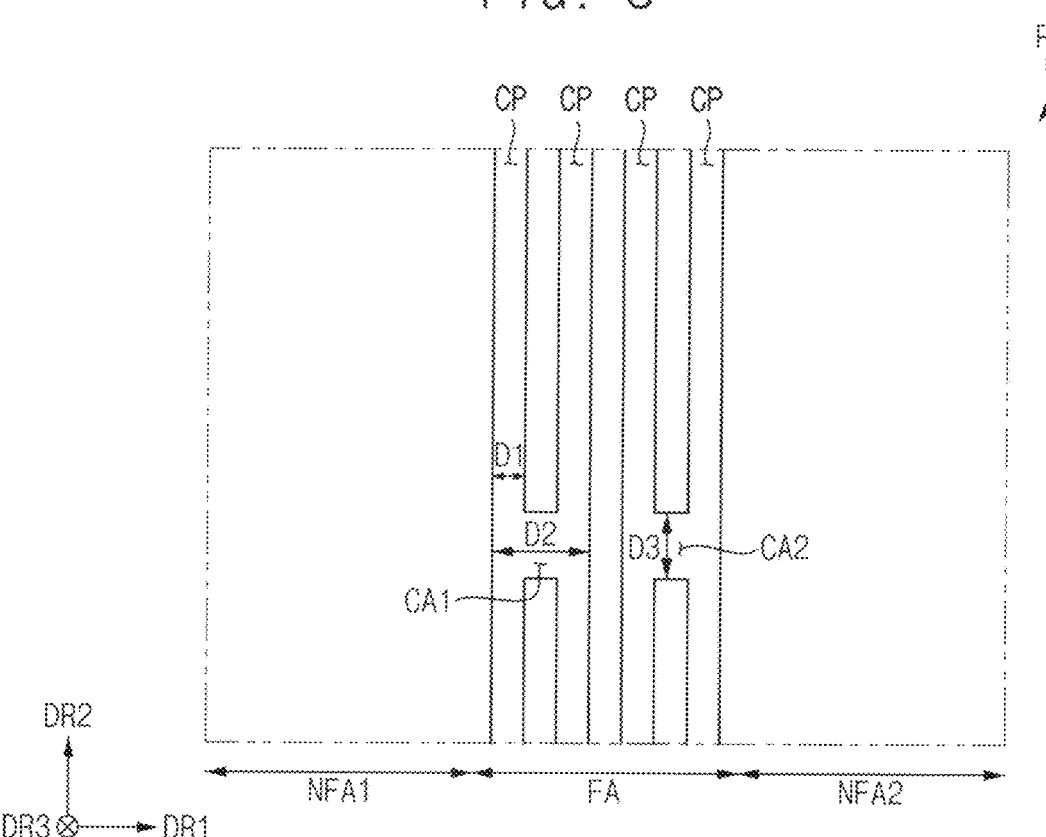
FIG. 8 and FIG. 9 are diagrams illustrating a protective layer included in the foldable display device of FIG. 1 according to an embodiment.
Figure 9:
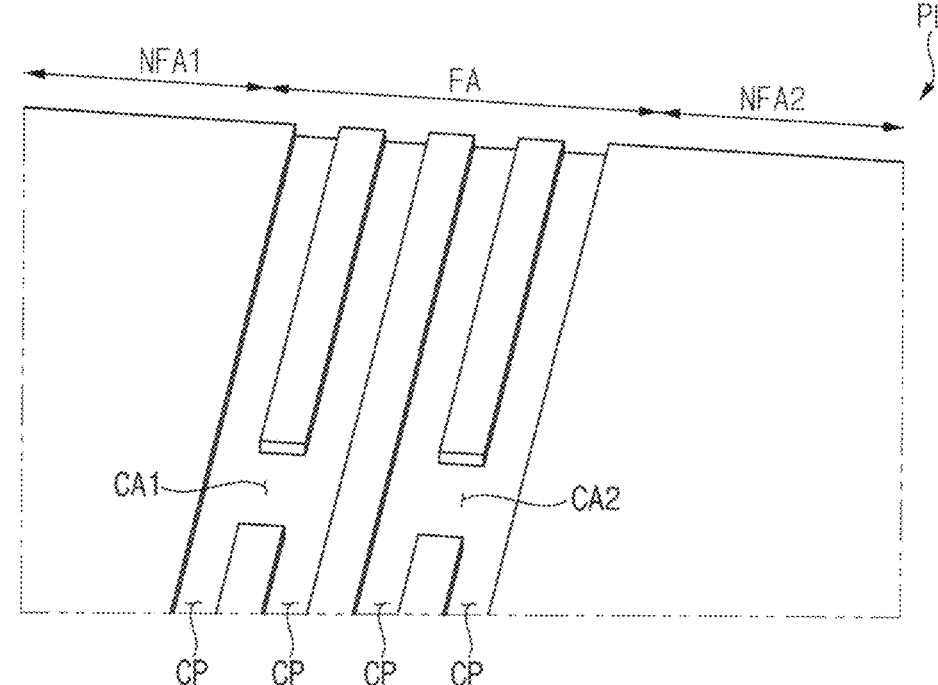

FIG. 8 and FIG. 9 are diagrams illustrating a protective layer PL included in the foldable display device DD of FIG. 1 according to an embodiment. FIG. 8 and FIG. 9 are diagrams illustrating a plurality of concave portions CP, and connection areas CA1 and CA2 formed (or provided) at a lower surface of the protective layer PL.

Referring to FIG. 8 and FIG. 9, some of the plurality of concave portions CP (e.g., a plurality of first concave portions) may be connected to each other. For example, concave portions CP adjacent to each other along the first direction DR1 among the plurality of concave portions CP may be connected to each other by the first connection area CA1 (e.g., a first area) and the second connection area CA2 (e.g., a second area). In an embodiment, a first group of first concave portions (e.g., left pair of concave portions CP in FIG. 8) may be connected to each other by the first connection area CA1 while a second group of first concave portions (e.g., right pair of concave portions CP in in FIG. 8) may be connected to each other by the second connection area CA2. The respective connection area may be a concave connection area defined in the protective layer PL.

The first connection area CA1 and the second connection area CA2 may be formed by a same process (e.g., a concave process or recess process) as the plurality of concave portions CP, and therefore, may have a same depth as the plurality of concave portions CP. The first connection area CA1 and the second connection area CA2 may be formed to be disposed on an imaginary line extending in the first direction DR1, along the protective layer PL. That is, the first connection area CA1 and the second connection area CA2 may be aligned with each other along the first direction DR1. A thickness of the protective layer PL in the first connection area CA1 and the second connection area CA2 may be substantially the same as a thickness of the protective layer PL at the plurality of concave portions CP.

The plurality of concave portions CP may have a first width D1 in the first direction DR1. The first width D1 may be smaller than a width of the measuring tip for measurement of the depth of the plurality of concave portions CP. Accordingly, in the plurality of concave portions CP, it may be impossible to measure a depth of the protective layer PL.

The first connection area CA1 and the second connection area CA2 may have a second width D2 in the first direction DR1. The second width D2 may be larger than the first width D1. In addition, the first connection area CA1 and the second connection area CA2 may have a third width D3 in the second direction DR2. The third width D3 may be larger than the first width D1. The second width D2 and the third width D3 may be larger than the width of the measuring tip. Accordingly, the measuring tip may measure the depth of the plurality of concave portions CP through measurement of the depth at the first connection area CA1 and the second connection area CA2.

As the first connection area CA1 and the second connection area CA2 are formed in the folding area FA, a rigidity of the protective layer PL may decrease in the folding area FA. Accordingly, the foldable display device DD may be easily folded.

Figure 10:
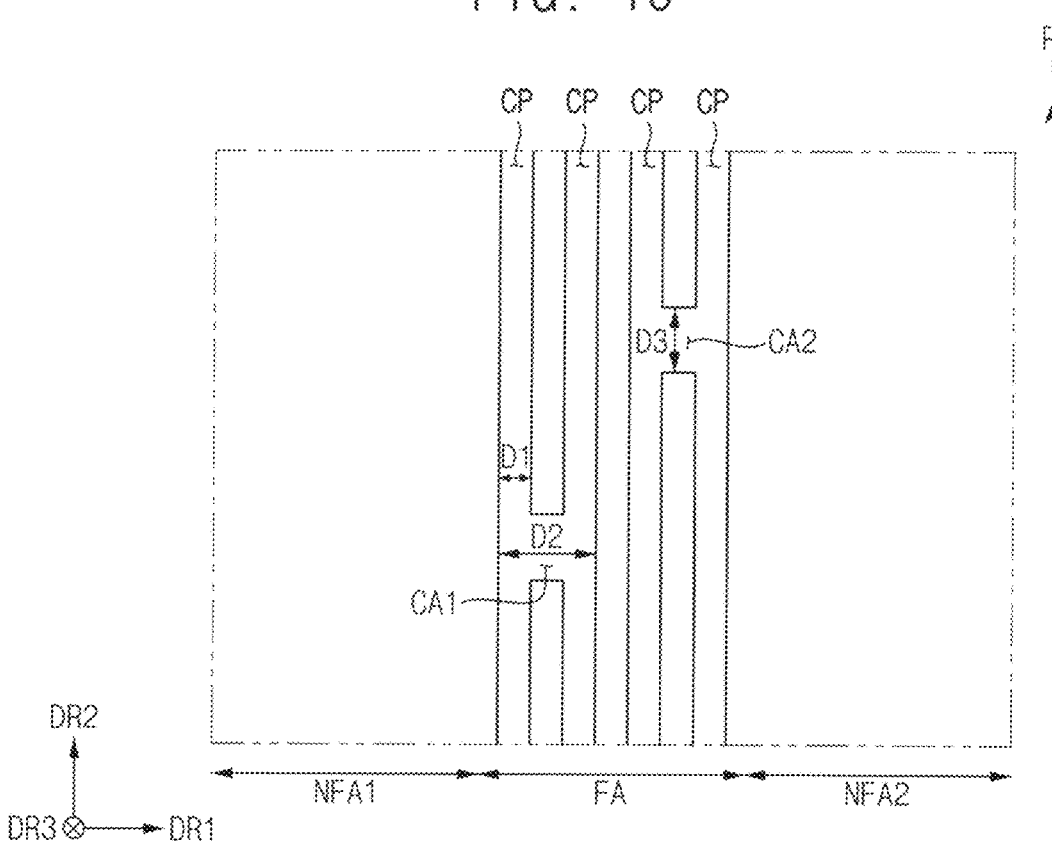
FIG. 10 and FIG. 11 are diagrams illustrating a protective layer included in the foldable display device of FIG. 1 according to an embodiment.
Figure 11:
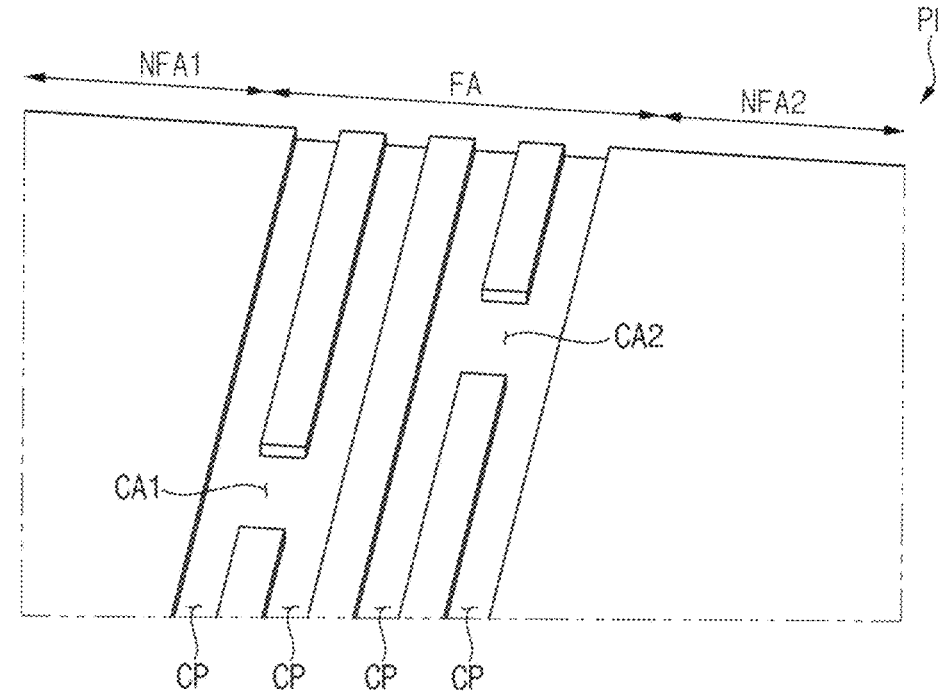

FIG. 10 and FIG. 11 are diagrams illustrating a protective layer PL included in the foldable display device DD of FIG. 1 according to an embodiment. FIG. 10 and FIG. 11 may be substantially the same as FIG. 8 and FIG. 9 except that a position of the second connection area CA2 is changed. Accordingly, description of the overlapping configuration will be omitted.

Referring to FIG. 10 and FIG. 11, a plurality of imaginary lines (e.g., virtual lines) may be extended along the first direction DR1, and spaced apart from each other along the second direction DR2. The second connection area CA2 may be positioned spaced apart from the first connection area CA1 along the second direction DR2, such as being on a different imaginary line than the first connection area CA1. Accordingly, the measuring tip for measurement of the depth of the plurality of concave portions CP may move in (or along) the second direction DR2 to measure depths of the plurality of concave portions CP at various positions along the protective layer PL.

Figure 12:
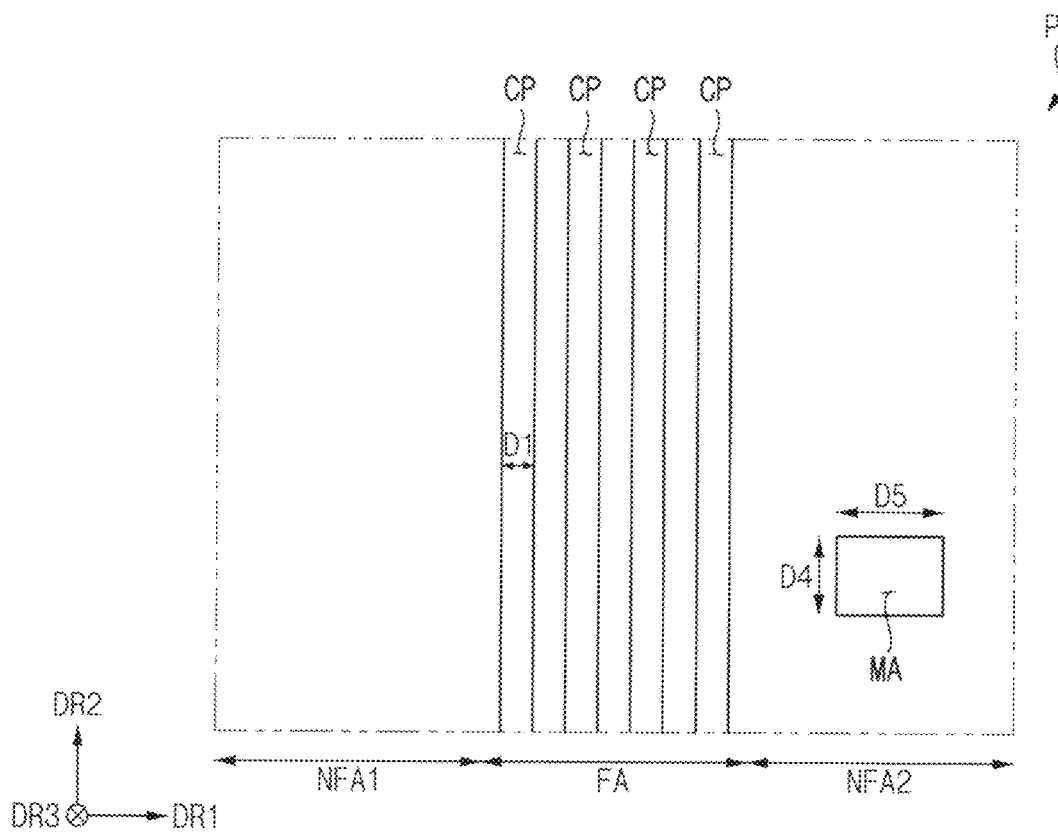
FIG. 12 and FIG. 13 are diagrams illustrating a protective layer included in the foldable display device of FIG. 1 according to an embodiment.
Figure 13:
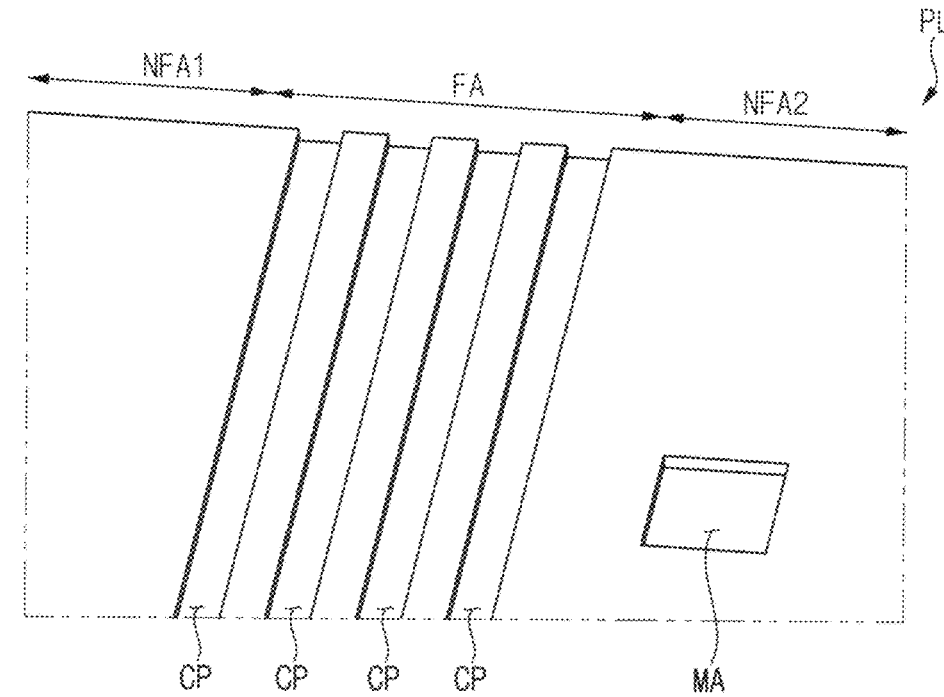

FIG. 12 and FIG. 13 are diagrams illustrating a protective layer PL included in the foldable display device DD of FIG. 1 according to an embodiment.

Referring to FIG. 12 and FIG. 13, the protective layer PL may include a measuring area MA. The measuring area MA may be formed in a non-folding area such as the second non-folding area NFA2 among a plurality of non-folding areas. FIG. 12 illustrates an embodiment which the measuring area MA is located only in the second non-folding area NFA2, however, this is an example. The position in which the measuring area MA is located is not limited thereto. The measuring area MA may be formed (or defined) in at least one of the first non-folding area NFA1 and the second non-folding area NFA2. In addition, two or more measuring areas may be formed.

The measuring area MA may be formed by a same process as the plurality of concave portions CP, and therefore, may have a same depth as the plurality of concave portions CP (e.g., a measuring concave portion). Accordingly, a depth of the measuring area MA may be substantially the same as the depth of the each of the plurality of concave portions CP and/or a connection area. In an embodiment, for example, the support layer (e.g., the protective layer PL or the substrate SUB) has a thickness at the first concave portion (e.g., concave portion CP) which corresponds to the folding area FA, the second concave portion (e.g., the measurement area MA) which corresponds to the non-folding area has a depth which is measurable, and measurement of the depth of the second concave portion in the non-folding area, measures the thickness of the support layer at the first concave portion.

The measuring area MA may have a fourth width D4 in the second direction DR2, and a fifth width D5 in the first direction DR1. That is, the measurement concave area may be a discrete concave portion spaced apart from the plurality of concave portions CP, along the first direction DR1. Each of the fourth width D4 and the fifth width D5 may be larger than the first width D1. Accordingly, the measuring tip for measurement of the depth of the plurality of concave portions CP may measure the depth of the protective layer PL through the measuring area MA, to determine whether the protective layer PL has a desired thickness corresponding to the depth of the plurality of concave portions CP. That is, the thickness of the protective layer PL at the plurality of concave portions CP, is directly related to a depth of various concave recesses such as the plurality of concave portions CP as a plurality of concave recesses, the connection area CA as a concave recess, the measuring area MA as a concave recess, etc., since these features are provided in a same process. More specifically, the depth of the connection area CA and the measuring area MA corresponds to the depth of the plurality of the concave portions CP since all of these features are provided in the protective layer PL in a same process as described above.

FIG. 14, FIG. 15, FIG. 16, FIG. 17, FIG. 18, and FIG. 19 are diagrams illustrating a protective layer PL included in the foldable display device DD of FIG. 1 according to an embodiment.

Figure 14:
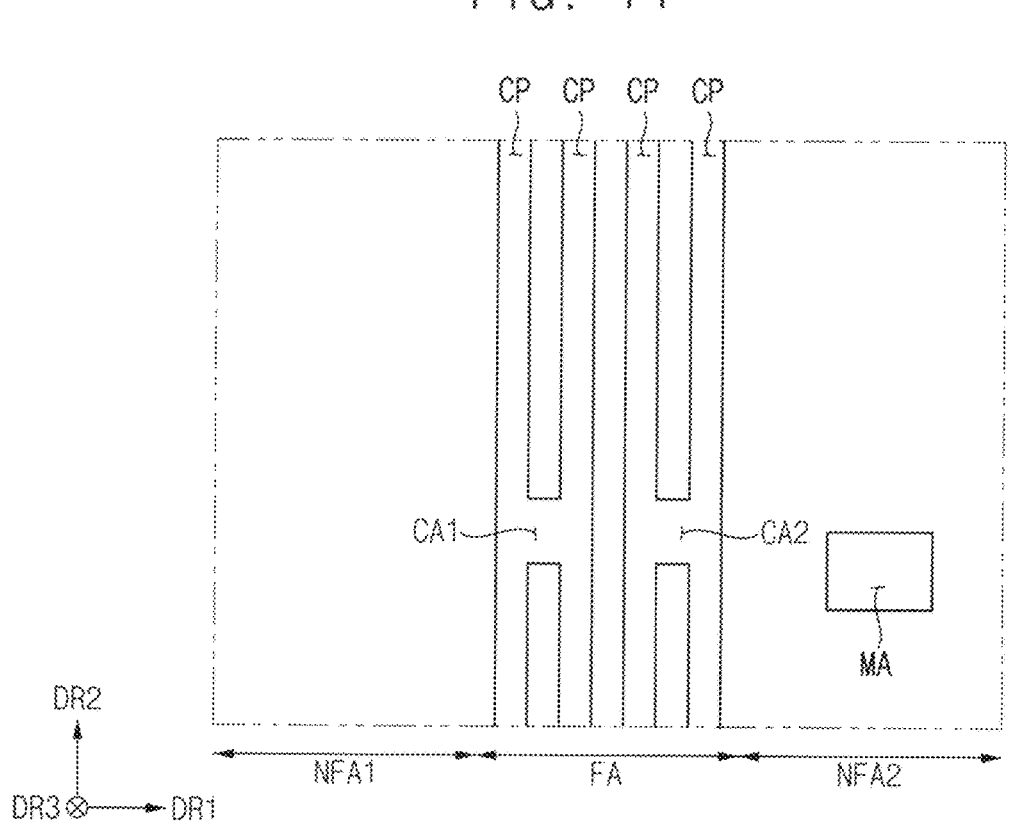
FIG. 14, FIG. 15, FIG. 16, FIG. 17, FIG. 18, and FIG. 19 are diagrams illustrating a protective layer included in the foldable display device of FIG. 1 according to an embodiment.

FIG. 14 is a diagram illustrating that the first connection area CA1, the second connection area CA2 and the measuring area MA are formed (or defined) in the protective layer PL together with each other, and the first connection area CA1 and the second connection area CA2 are disposed on a same imaginary line extending the first direction DR1. The measuring area MA may be defined on the same imaginary line along which the first connection area CA1 and the second connection area CA2 are provided, without being limited thereto.

Figure 15:
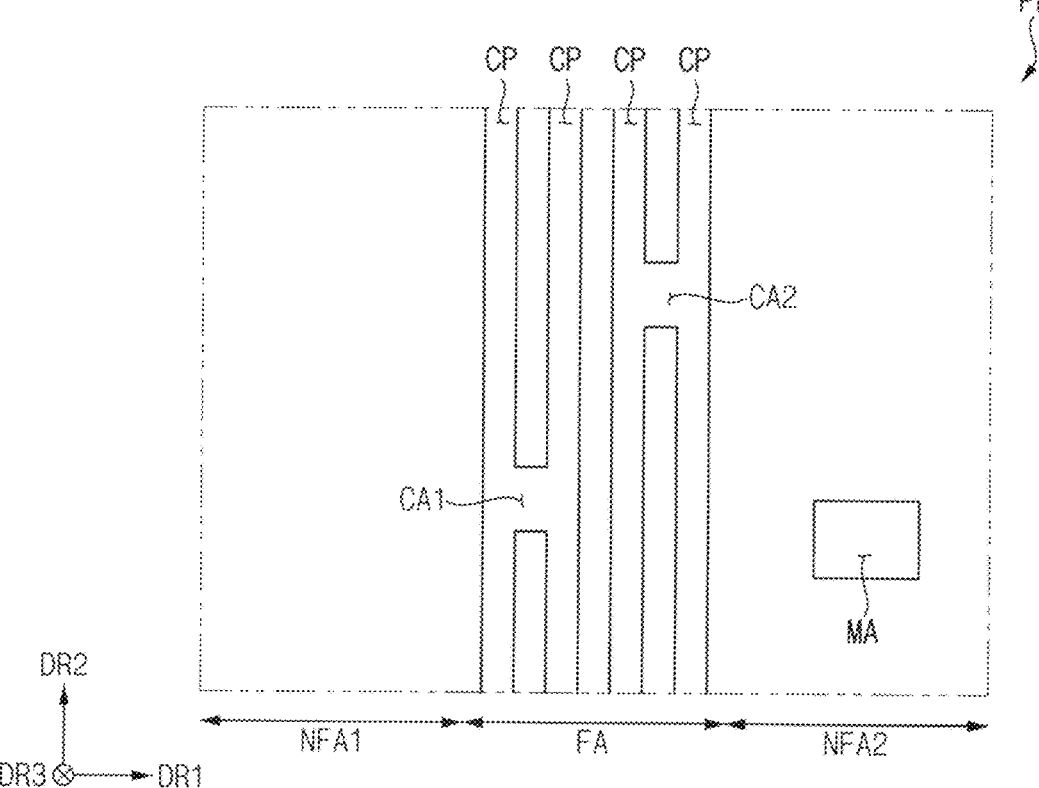

FIG. 15 is a diagram illustrating that the first connection area CA1, the second connection area CA2 and the measuring area MA are formed together with each other, and the first connection area CA1 and the second connection area CA2 are located at different positions (or virtual lines) along the second direction DR2.

Figure 16:
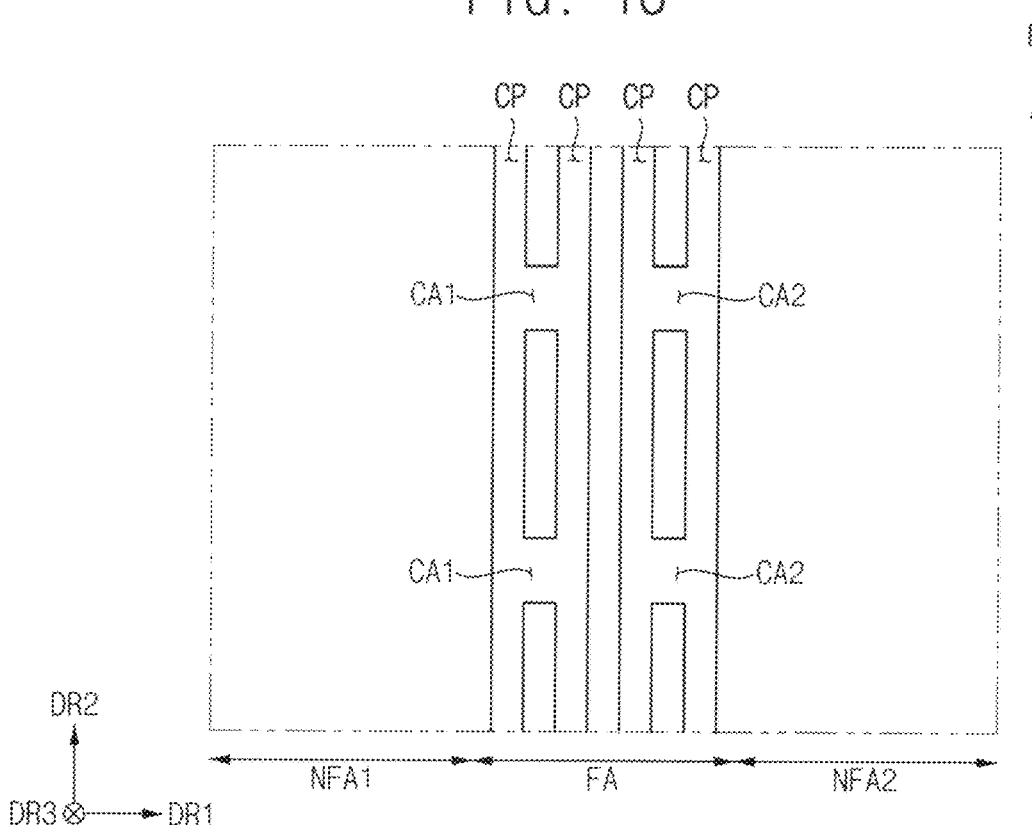

FIG. 16 is a diagram illustrating that a plurality of first connection areas CA1 and a plurality of second connection areas CA2 are formed along a length of the plurality of concave portions CP in the second direction DR2. The first connection area CA1 and the second connection area CA2 are disposed on a same imaginary line extending in the first direction DR1.

Figure 17:
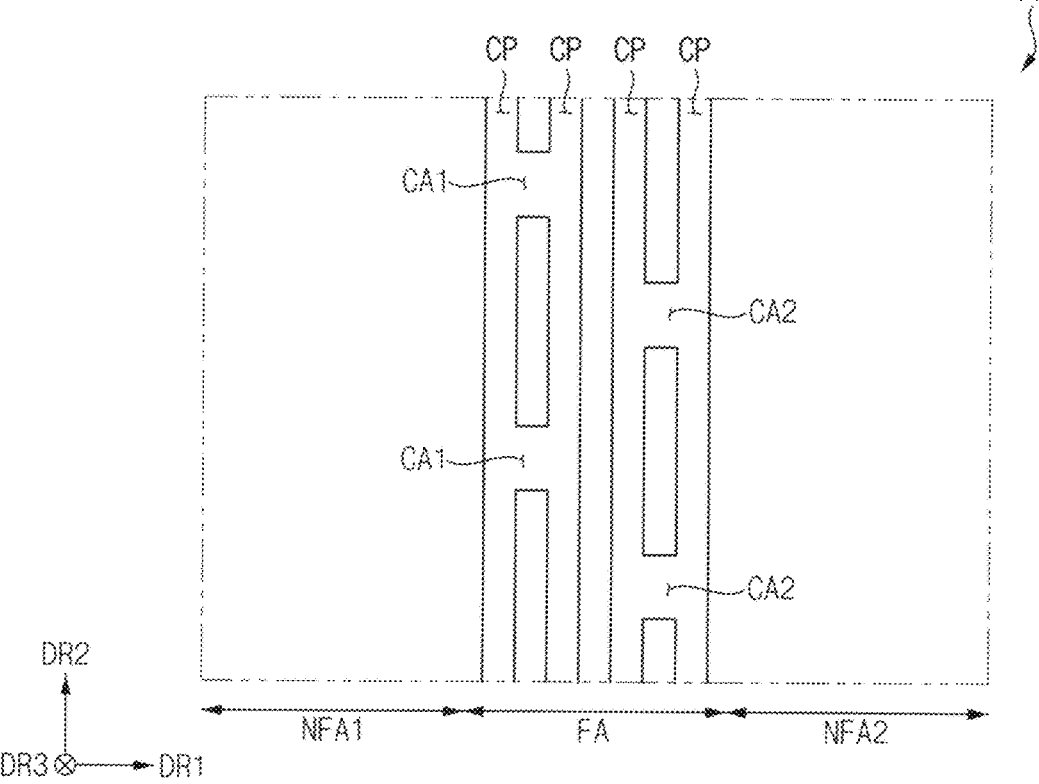

FIG. 17 is a diagram illustrating that a plurality of first connection areas CA1 and a plurality of second connection areas CA2 are formed along a length of the plurality of concave portions CP in the second direction DR2. The first connection area CA1 and the second connection area CA2 are located at different position in the second direction DR2.

Figure 18:
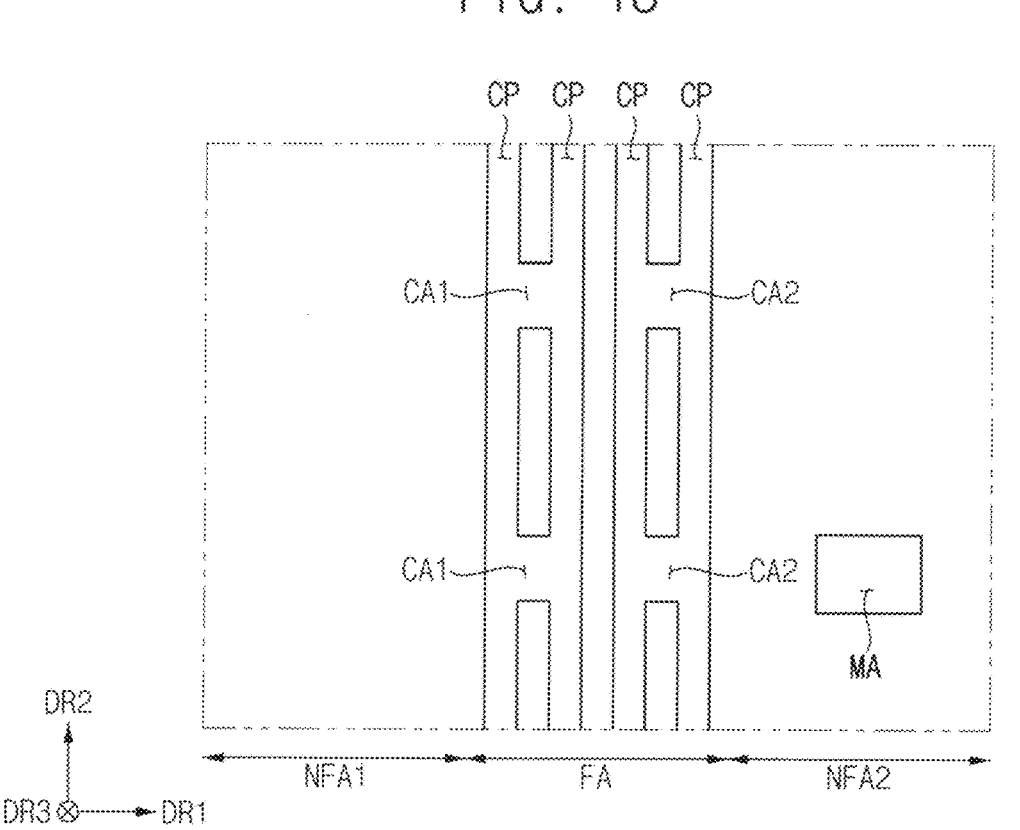
Figure 19:
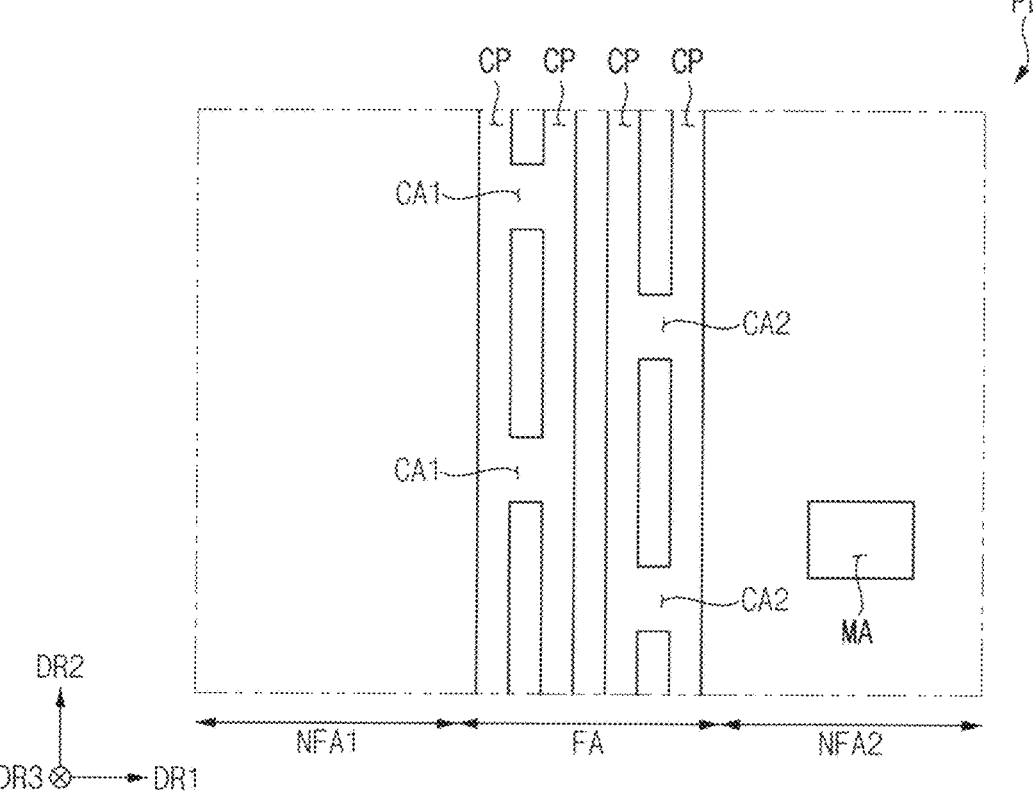

FIG. 18 is substantially the same as FIG. 16 except that the measuring area MA is added, and FIG. 19 is substantially the same as FIG. 17 except that a measuring area MA is added.

Figure 20:
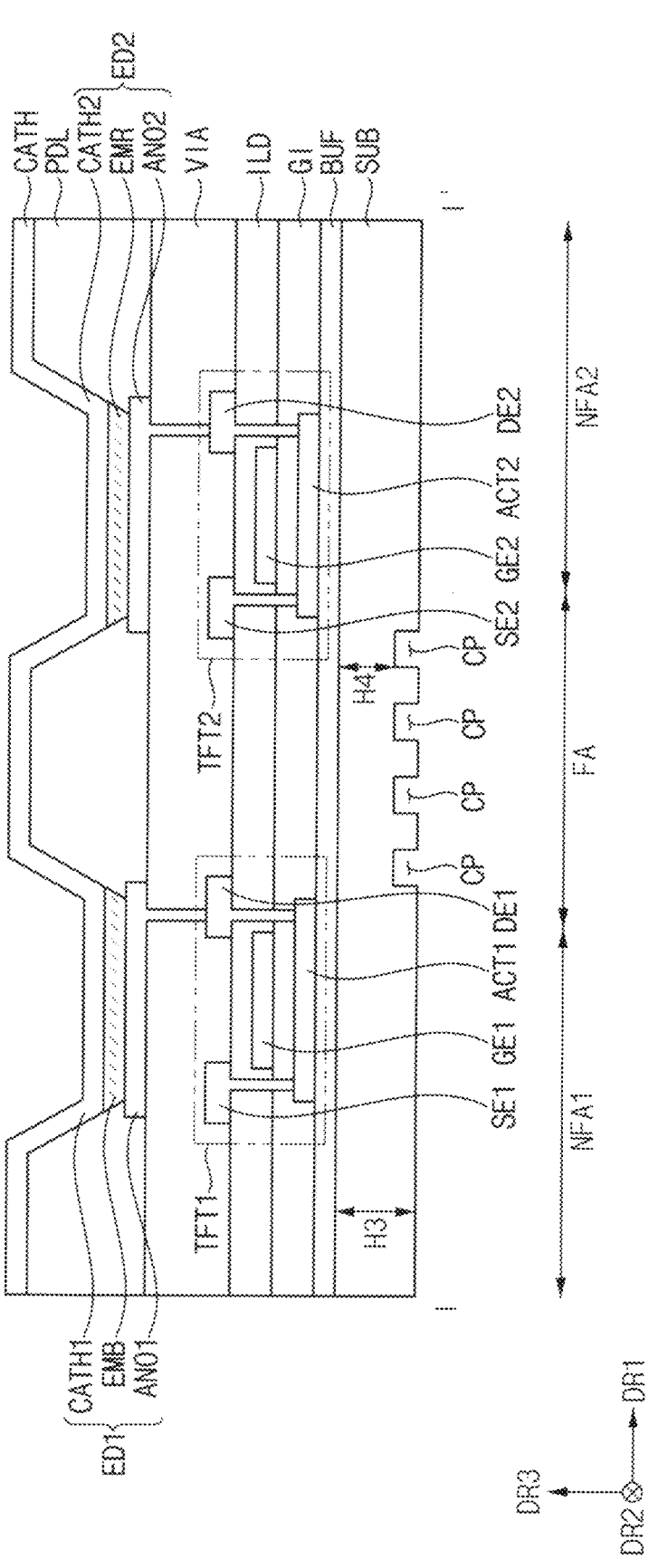
FIG. 20 is a cross-sectional view illustrating a portion of a display panel included in the foldable display device of FIG. 1.

FIG. 20 is a cross-sectional view illustrating a portion of a display panel DP included in the foldable display device DD of FIG. 1. FIG. 20 is a diagram illustrating a structure from a substrate SUB to a cathode electrode CATH, of a display panel DP.

Referring to FIG. 1 and FIG. 20, the foldable display device DD may include a substrate SUB, a buffer layer BUF, a gate insulation layer GI, an interlayer insulation layer ILD, a via insulation layer VIA, a first transistor TFT1, a second transistor TFT2, a first light emitting diode ED1, a second light emitting diode ED2, and a pixel defining layer PDL.

The first transistor TFT1 may include a first active layer ACT1, a first gate electrode GE1, a first source electrode SE1, and a first drain electrode DE1. The second transistor TFT2 may include a second active layer ACT2, a second gate electrode GE2, a second source electrode SE2, and a second drain electrode DE2.

The first light emitting diode ED1 may include a first anode electrode ANO1, a first light emitting layer EMB, a first cathode electrode CATH1. The second light emitting diode ED2 may include a second anode electrode ANO2, a second light emitting layer EMR, and a second cathode electrode CATH2. The first cathode electrode CATH1 and the second cathode electrode CATH2 may be integrally formed. That is, each of the first cathode electrode CATH1 and the second cathode electrode CATH2 may be defined as respective portions of a cathode electrode CATH.

The foldable display device DD may include the first non-folding area NFA1, the second non-folding area NFA2, and the folding area FA.

The substrate SUB may include a flexible material or rigid material. For example, the substrate SUB may have flexible characteristic by including a polymer material such as polyimide. Or, for example, the substrate SUB may have rigid characteristic by including a glass-like material. When the substrate SUB is formed of glass as a rigid material, a plurality of concave portions CP may be formed (or defined) in the folding area FA to reduce rigidity of the substrate SUB at the folding area FA. The plurality of concave portions CP may be substantially the same as the plurality of concave portions CP formed in the above-described protective layer PL. That is, two rigid layers within the foldable display device DD may define a plurality of concave portions CP at the folding area FA.

The buffer layer BUF may be disposed on the substrate SUB. The buffer layer BUF may include an inorganic insulation material. For example, the buffer layer BUF may include a silicon oxide, a silicon nitride, a silicon oxynitride, etc. These may be used alone or in combination with each other. The buffer layer BUF may block metal atoms or impurities from diffusing into the first and second active layers ACT1 and ACT2. Also, the buffer layer BUF may control the rate of heat provided to the first and second active layers ACT1 and ACT2 during a crystallization process for forming the first and second active layers ACT1 and ACT2.

The first and second active layers ACT1 and ACT2 may be disposed on the buffer layer BUF. In embodiments, the first and second active layers ACT1 and ACT2 may include a silicon semiconductor. For example, the first and second active layers ACT1 and ACT2 may include amorphous silicon, polycrystalline silicon, etc. Or, in embodiments, the first and second active layers ACT1 and ACT2 may include an oxide semiconductor. For example, the first and second active layers ACT1 and ACT2 may include indium-gallium-zinc oxide, indium-gallium oxide, indium-zinc oxide, etc.

The gate insulation layer GI may be disposed on the buffer layer BUF. The gate insulation layer GI may be disposed to cover the first and second active layers ACT1 and ACT2. The gate insulation layer GI may include an insulation material. For example, the gate insulation layer GI may include silicon oxide, silicon nitride, silicon oxynitride, etc. These may be used alone or in combination with each other.

The first and the second gate electrodes GE1 and GE2 may be disposed on the gate insulation layer GI. The first and the second gate electrodes GE1 and GE2 may overlap (or correspond to) the first and second active layers ACT1 and ACT2. In response to a gate signal as an electrical signal provided to the first and second gate electrodes GE1 and GE2, a signal (e.g., control signal or driving signal) and/or a voltage may flow through the first and second active layers ACT1 and ACT2. In an embodiment, the first and second gate electrodes GE1 and GE2 may include metal, alloy, metal oxide, transparent conductive material, etc. For example, the first and second gate electrodes GE1 and GE2 may include silver, alloy including silver, molybdenum, alloy including molybdenum, aluminum, alloy including aluminum, aluminum nitride, tungsten, tungsten nitride, copper, nickel, chromium, chromium nitride, titanium, tantalum, platinum, scandium, indium tin oxide, indium zinc oxide, etc.

The interlayer insulation layer ILD may be disposed on the gate insulation layer GI. The interlayer insulation layer ILD may be disposed to cover the first and second gate insulation layers GE1 and GE2. In an embodiment, the interlayer insulation layer ILD may include an insulation material. For example, the interlayer insulation layer ILD may include a silicon oxide, silicon nitride, silicon oxynitride, etc. These may be used alone or in combination with each other.

The first and second source electrodes SE1 and SE2 and the first and second drain electrodes DE1 and DE2 may be disposed on the interlayer insulation layer ILD. The first source electrode SE1 and the first drain electrode DE1 may contact the first active layer ACT1. The second source electrode SE2 and the second drain electrode DE2 may contact the second active layer ACT2. As contacting, elements may form an interface therebetween without being limited thereto. In an embodiment, each of the first and second source electrodes SE1 and SE2 and the first and second drain electrodes DE1 and DE2 may include metal, alloy, metal oxide, transparent conductive material, etc. For example, each of the first and second source electrodes SE1 and SE2 and the first and second drain electrodes DE1 and DE2 may include silver, alloy including silver, molybdenum, alloy including molybdenum, aluminum, alloy including aluminum, aluminum nitride, tungsten, tungsten nitride, copper, nickel, chromium, chromium nitride, titanium, tantalum, platinum, scandium, indium tin oxide, indium zinc oxide, etc.

The via insulation layer VIA may be disposed on the interlayer insulation layer ILD. The via insulation layer VIA may be disposed to cover the first and second source electrodes SE1 and SE2 and the first and second drain electrodes DE1 and DE2. In an embodiment, the via insulation layer VIA may include an organic insulation material. For example, the via insulation layer VIA may include photoresist, polyacrylic resin, polyimide resin, acrylic resin, etc. The via insulation layer VIA may have a substantially flat upper surface.

The substrate SUB, the buffer layer BUF, the gate insulation layer GI, the interlayer insulation layer ILD, the via insulation layer VIA, the first transistor TFT1, and the second transistor TFT2 may together constitute a transistor substrate.

The first and second anode electrodes ANO1 and ANO2 may be disposed on the via insulation layer VIA. The first and second anode electrodes ANO1 and ANO2 may contact the first and second drain electrodes DE1 and DE2. In an embodiment, each of the first and second anode electrodes ANO1 and ANO2 may include metal, alloy, metal oxide, transparent conductive material, etc. For example, each of the first and second anode electrodes ANO1 and ANO2 may include silver, alloy including silver, molybdenum, alloy including molybdenum, aluminum, alloy including aluminum, aluminum nitride, tungsten, tungsten nitride, copper, nickel, chromium, chromium nitride, titanium, tantalum, platinum, scandium, indium tin oxide, indium zinc oxide, etc.

The pixel defining layer PDL may be disposed on the via insulation layer VIA. The pixel defining layer PDL may define an opening exposing the first and second anode electrodes ANO1 and ANO2 to outside the pixel defining layer PDL. In an embodiment, the pixel defining layer PDL may include an organic insulation material. For example, the pixel defining layer PDL may include photoresist, polyacrylic resin, polyimide resin, acrylic resin, etc.

The first and second light emitting layers EMB and EMR may be respectively disposed on the first and second anode electrodes ANO1 and ANO2. The first and second light emitting layers EMB and EMR may include an organic material emitting light having a predetermined color. The first and second light emitting layers EMB and EMR may emit light based on a potential difference (e.g., electrical potential difference) respectively between the first and second anode electrodes ANO1 and ANO2, and the first and second cathode electrodes CATH1 and CATH2.

The first and second cathode electrodes CATH1 and CATH2 may be disposed on the first and second light emitting layers EMB and MBR. The first and second cathode electrodes CATH1 and CATH2 may include metal, alloy, metal oxide, transparent conductive material, etc. For example, the first and second cathode electrodes CATH1 and CATH2 may include silver, alloy including silver, molybdenum, alloy including molybdenum, aluminum, alloy including aluminum, aluminum nitride, tungsten, tungsten nitride, copper, nickel, chromium, chromium nitride, titanium, tantalum, platinum, scandium, indium tin oxide, indium zinc oxide, etc.

Figure 21:
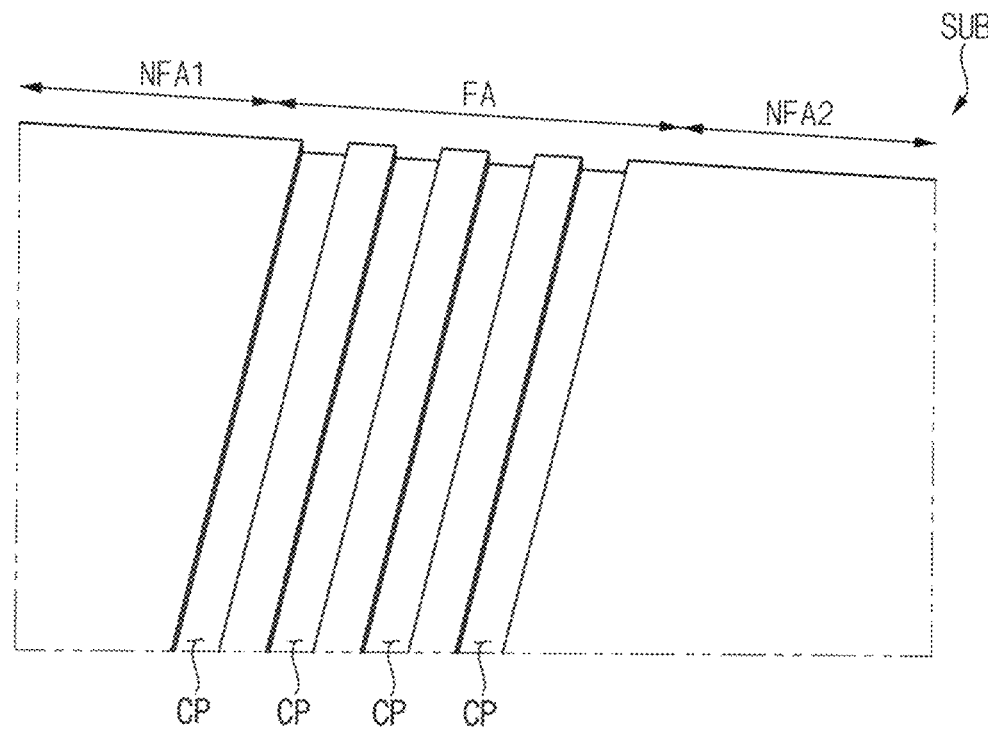
FIG. 21 and FIG. 22 are diagrams illustrating a substrate included in the foldable display device of FIG. 1.
Figure 22:
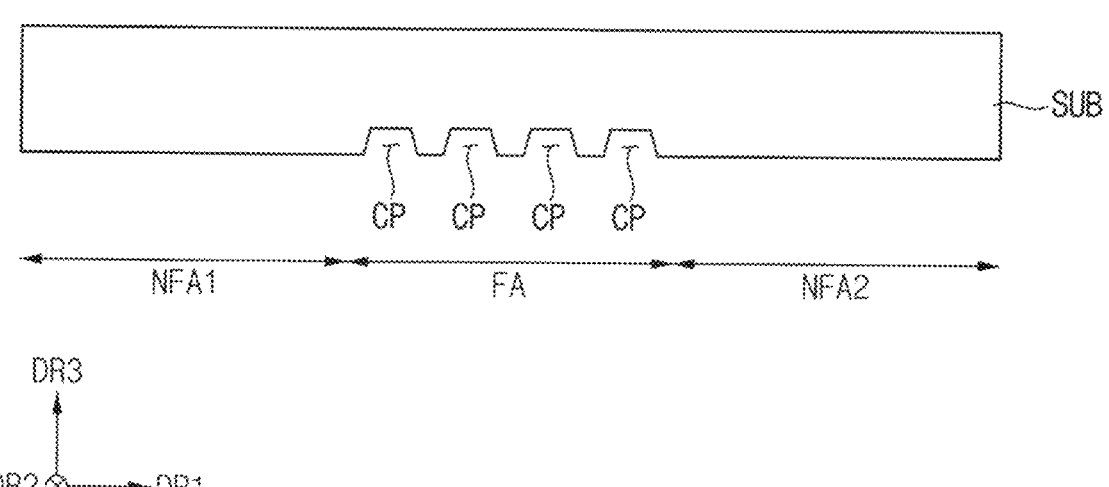

FIG. 21 and FIG. 22 are diagrams illustrating a substrate SUB included in the foldable display device DD of FIG. 1.

Referring to FIG. 21 and FIG. 22, the substrate SUB may include a plurality of concave portions CP (e.g., a plurality of second concave portions) in the folding area FA. The plurality of concave portions CP may be spaced apart from each other in the first direction DR1, and may be extended in the second direction DR2. Each of the concave portions CP may be recessed from a lower surface of the substrate SUB which is closest to the protective layer PL, without being limited thereto. The concave portion CP may be open in a direction toward the protective layer PL.

As shown in FIG. 20, the substrate SUB may have a third height H3 (e.g., a third thickness) in general, and the third height H3 may define a maximum thickness of the substrate SUB. However, in an area of the substrate SUB which corresponds to the plurality of concave portions CP of the substrate SUB, the substrate SUB may have a fourth height H4 (e.g., a fourth thickness) lower than the third height H3. Since the substrate SUB has relatively low height in the folding area FA, a rigidity of the substrate SUB in the folding area FA may be reduced. To this end, the folding area FA of the foldable display device DD may be easily folded.

The plurality of concave portions CP may be formed to have a uniform depth in the third direction DR3. A measuring device including a measuring tip may be used to confirm whether the plurality of concave portions CP is formed to have a uniform depth. However, when a width of the plurality of concave portions CP in the first direction DR1 is reduced, it may be difficult to measure the depth of the plurality of concave portions CP.

Figure 23:
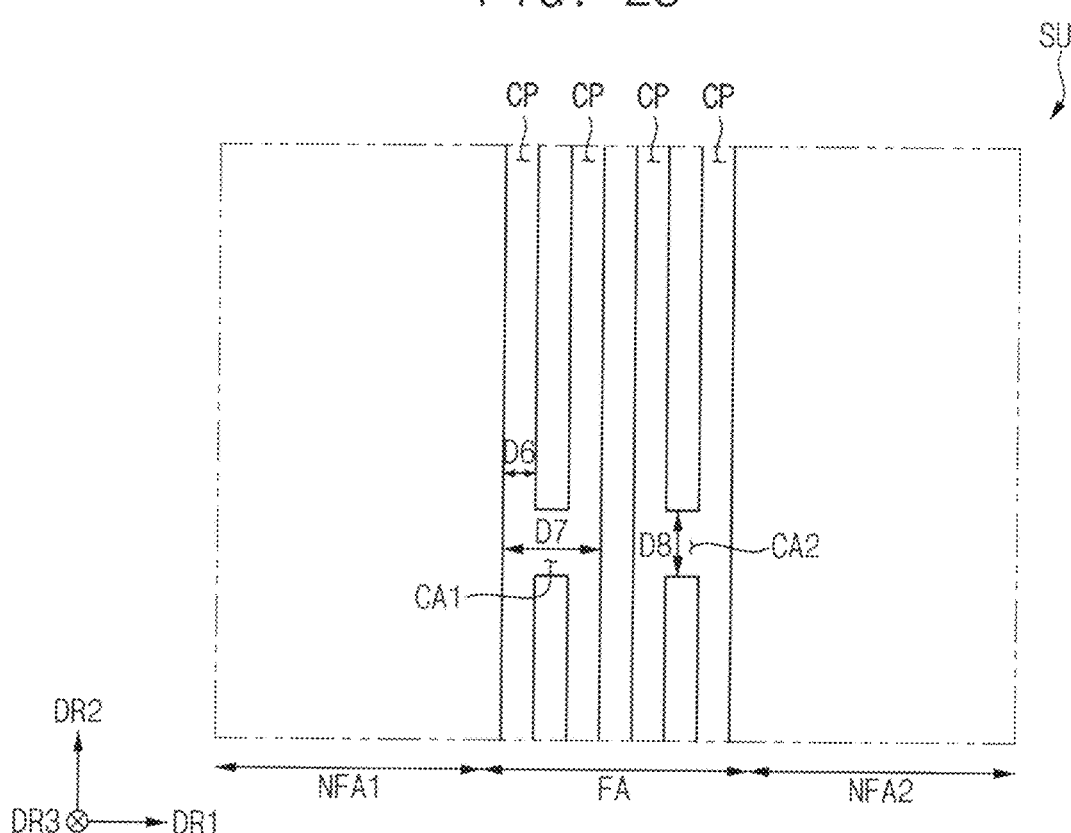
FIG. 23 and FIG. 24 are diagrams illustrating a substrate included in the foldable display device of FIG. 1.
Figure 24:
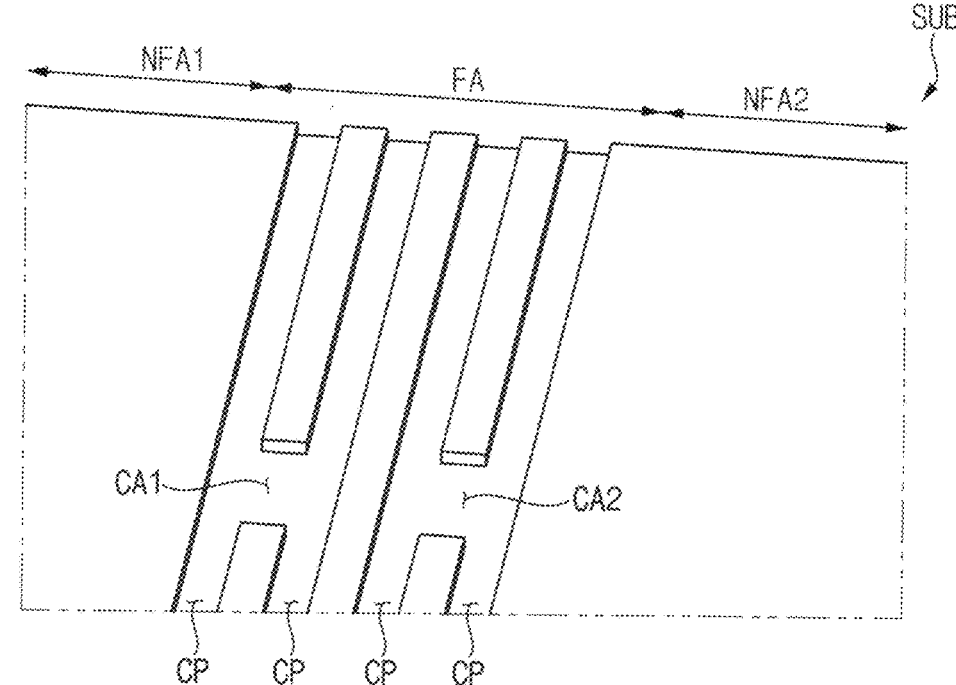

FIG. 23 and FIG. 24 are diagrams illustrating a substrate SUB included in the foldable display device DD of FIG. 1. FIG. 23 and FIG. 24 are diagrams illustrating a plurality of concave portions CP and a plurality of connection areas CA1 and CA2 formed recessed from a lower surface of the substrate SUB. A single connection area may be provided along a length of connected concave portions CP, but is not limited thereto.

Referring to FIG. 23 and FIG. 24, some of the plurality of concave portions CP may be connected to each other. For example, the plurality of concave portions CP may be connected to each other by the first connection area CA1 and the second connection area CA2. A single connection area may be provided along a length of connected concave portions CP, but is not limited thereto.

The first connection area CA1 and the second connection area CA2 may be formed by a same process as the plurality of concave portions CP, and therefore, may have a same depth as the plurality of concave portions CP. The first connection area CA1 and the second connection area CA2 may be formed to be disposed on a same imaginary line extending in the first direction DR1. A thickness of the substrate SUB at the first connection area CA1 and the second connection area CA2 may be substantially the same as a thickness of the substrate Sub at the plurality of concave portions CP.

The plurality of concave portions CP may have a sixth width D6 in the first direction DR1. The sixth width D6 may be smaller than a width of the measuring tip for measurement of the depth of the plurality of concave portions CP. Accordingly, in the plurality of concave portions CP, it may be impossible to measure a depth of the substrate SUB.

The first connection area CA1 and the second connection area CA2 may have a seventh width D7 in the first direction DR1. The seventh width D7 may be larger than the sixth width D6. In addition, the first connection area CA1 and the second connection area CA2 may have an eighth width D8 in the second direction DR2. The eighth width D8 may be larger than the sixth width D6. The seventh width D7 and the eighth width D8 may be larger than the width of the measuring tip. Accordingly, the measuring tip for measurement of the depth of the plurality of concave portions CP may measure the depth of the plurality of concave portions CP by measurement of the depth of the first connection area CA1 and/or the second connection area CA2.

As the first connection area CA1 and the second connection area CA2 are formed in the folding area FA, a rigidity of the protective layer PL may decrease in the folding area FA. Accordingly, the foldable display device DD may be easily folded.

Figure 25:
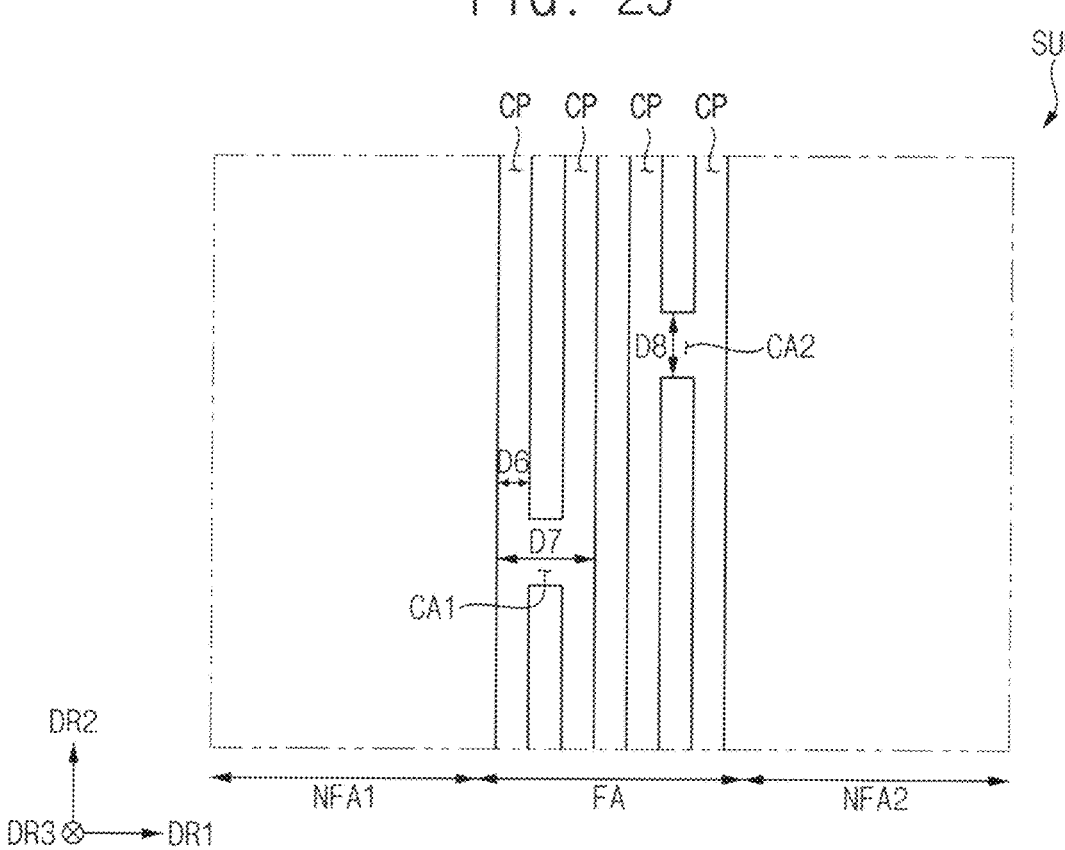
FIG. 25 and FIG. 26 are diagrams illustrating a substrate included in the foldable display device of FIG. 1.
Figure 26:
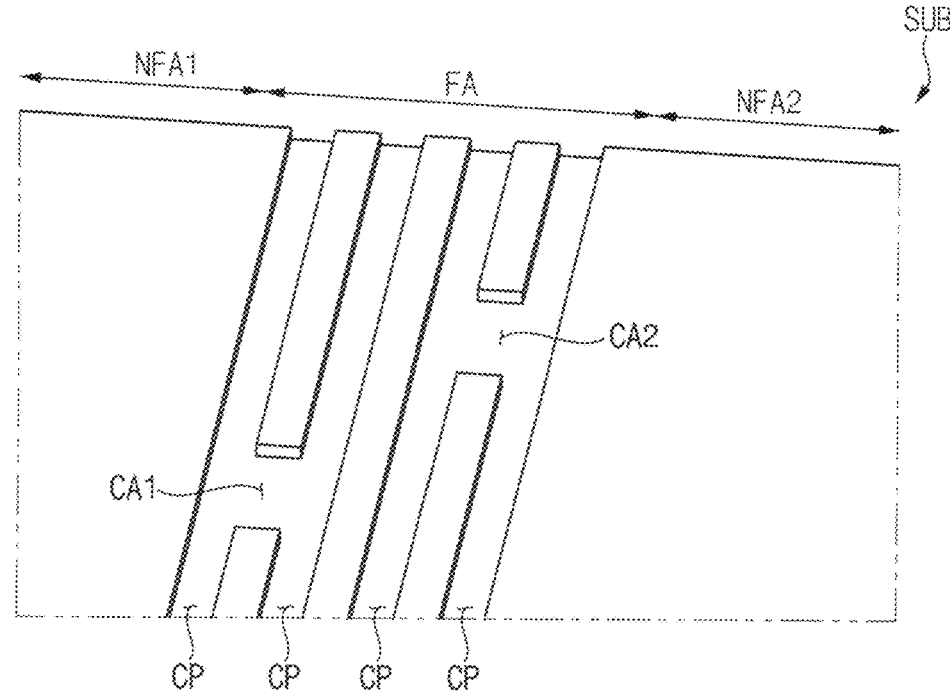

FIG. 25 and FIG. 26 are diagrams illustrating a substrate included in the foldable display device of FIG. 1. FIG. 25 and FIG. 26 may be substantially the same as FIG. 23 and FIG. 24 except that a position of the second connection area CA2 is changed. Accordingly, description of the overlapping configuration will be omitted.

Referring to FIG. 25 and FIG. 26, the second connection area CA2 may be positioned in the second direction DR2, on a virtual line different from the first connection area CA1. Accordingly, the measuring tip may move in the second direction DR2 to measure depths of the plurality of concave portions CP at various positions along the substrate SUB.

Figure 27:
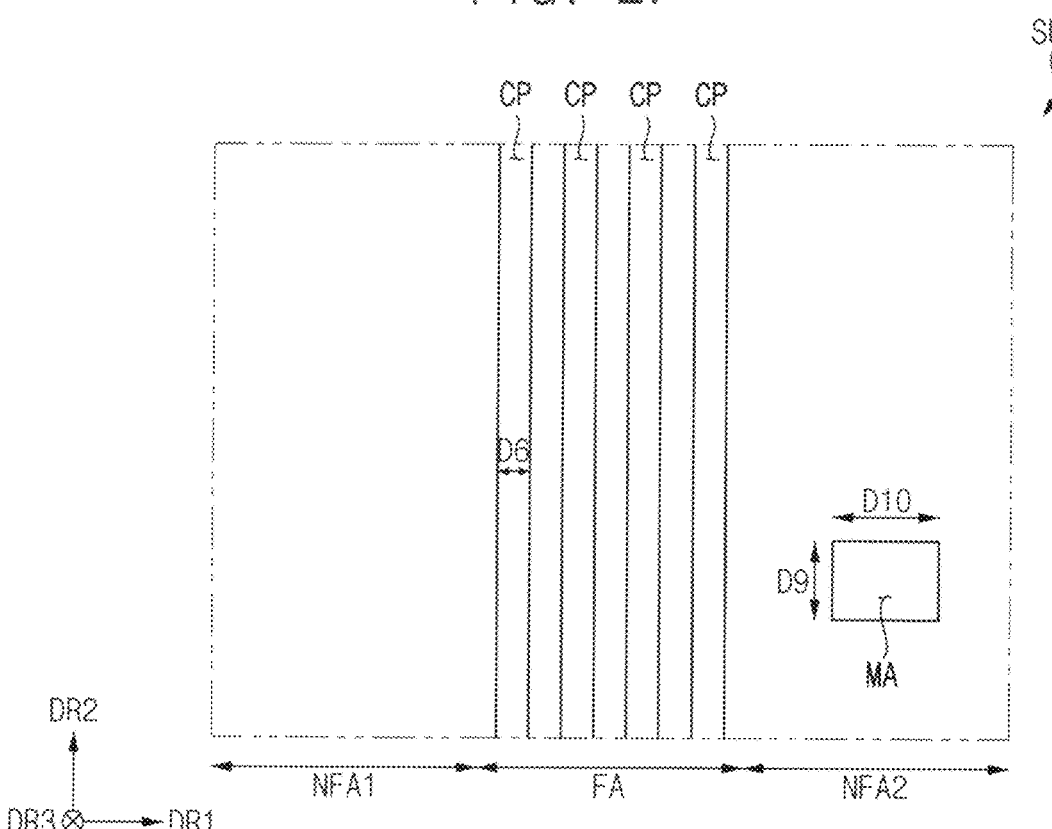
FIG. 27 and FIG. 28 are diagrams illustrating a substrate included in the foldable display device of FIG. 1.
Figure 28:
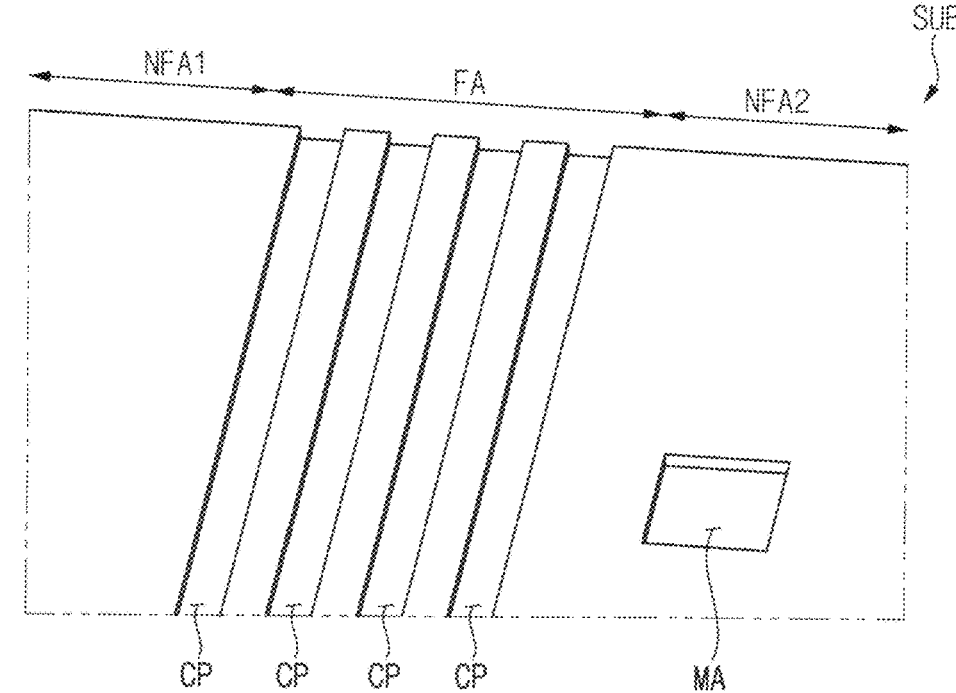

FIG. 27 and FIG. 28 are diagrams illustrating a substrate SUB included in the foldable display device DD of FIG. 1.

Referring to FIG. 27 and FIG. 28, the substrate SUB may include a measuring area MA. The measuring area MA may be formed in the second non-folding area NFA2. However, this is only an example. Position in which the measuring area MA is located is not limited thereto. The measuring area MA may be formed at least one of the first non-folding area NFA1 and the second non-folding area NFA2. The measuring area MA may be formed by a same process as the plurality of concave portions CP, and therefore, may have a same depth as the plurality of concave portions CP. Accordingly, a depth of the measuring area MA may be substantially the same as the depth of the each of the plurality of concave portions CP. The measuring area MA may have a ninth width D9 in the second direction DR2, and a tenth width D10 in the first direction DR1. Each of the ninth width D9 and the tenth width D10 may be larger than the sixth width D6. Accordingly, the measuring tip for measurement of the depth of the plurality of concave portions CP may measure the depth of the plurality of concave portions CP of the substrate SUB through the measuring area MA to determine whether the substrate SUB has a desired depth in the plurality of concave portions CP.

FIG. 29, FIG. 30, FIG. 31, FIG. 32, FIG. 33, and FIG. 34 are diagrams illustrating a substrate SUB included in the foldable display device DD of FIG. 1.

Figure 29:
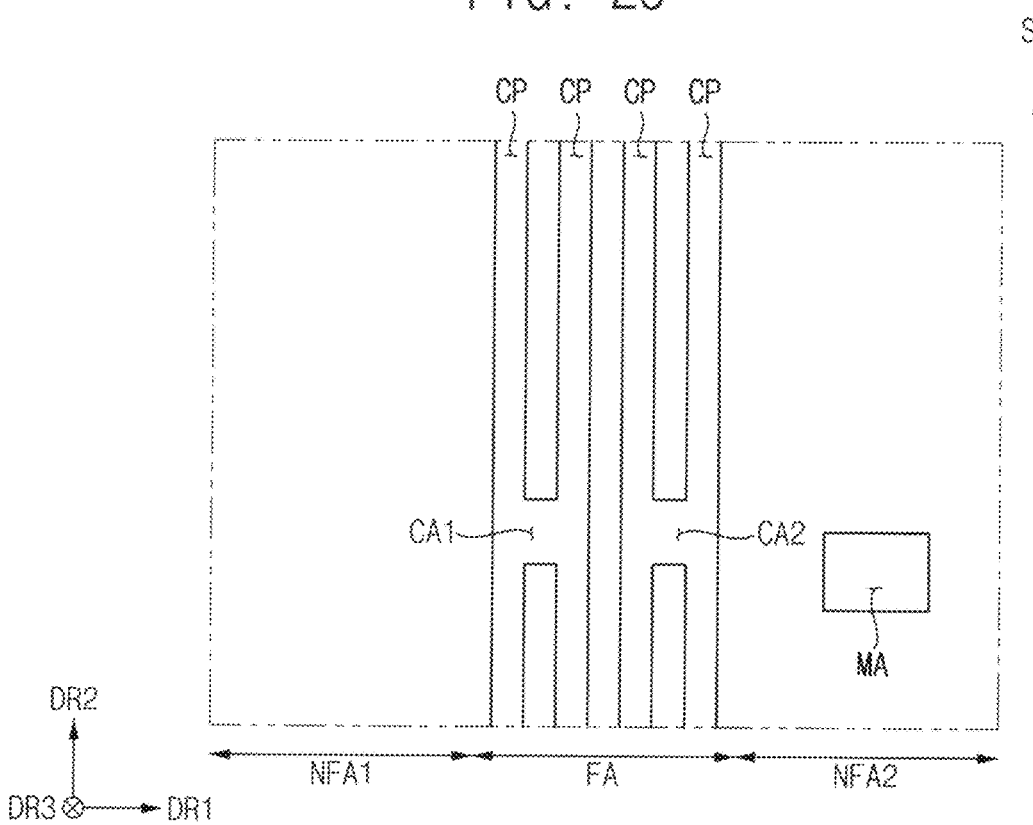
FIG. 29, FIG. 30, FIG. 31, FIG. 32, FIG. 33, and FIG. 34 are diagrams illustrating a substrate included in the foldable display device of FIG. 1.

FIG. 29 is a diagram illustrating that the first connection area CA1, the second connection area CA2 and the measuring area MA are formed together with each other, and the first connection area CA1 and the second connection area CA2 are disposed on a same imaginary line extending the first direction DR1.

Figure 30:
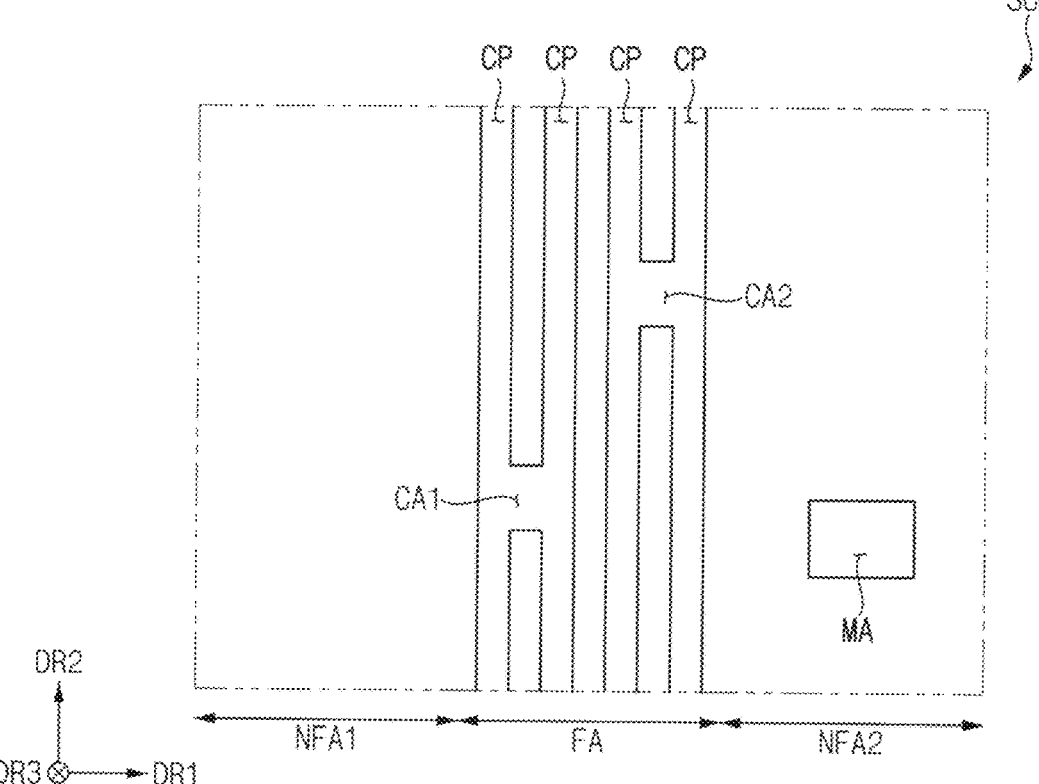

FIG. 30 is a diagram illustrating that the first connection area CA1, the second connection area CA2 and the measuring area MA are formed together with each other, and the first connection area CA1 and the second connection area CA2 are located at different positions (or virtual lines) along the second direction DR2.

Figure 31:
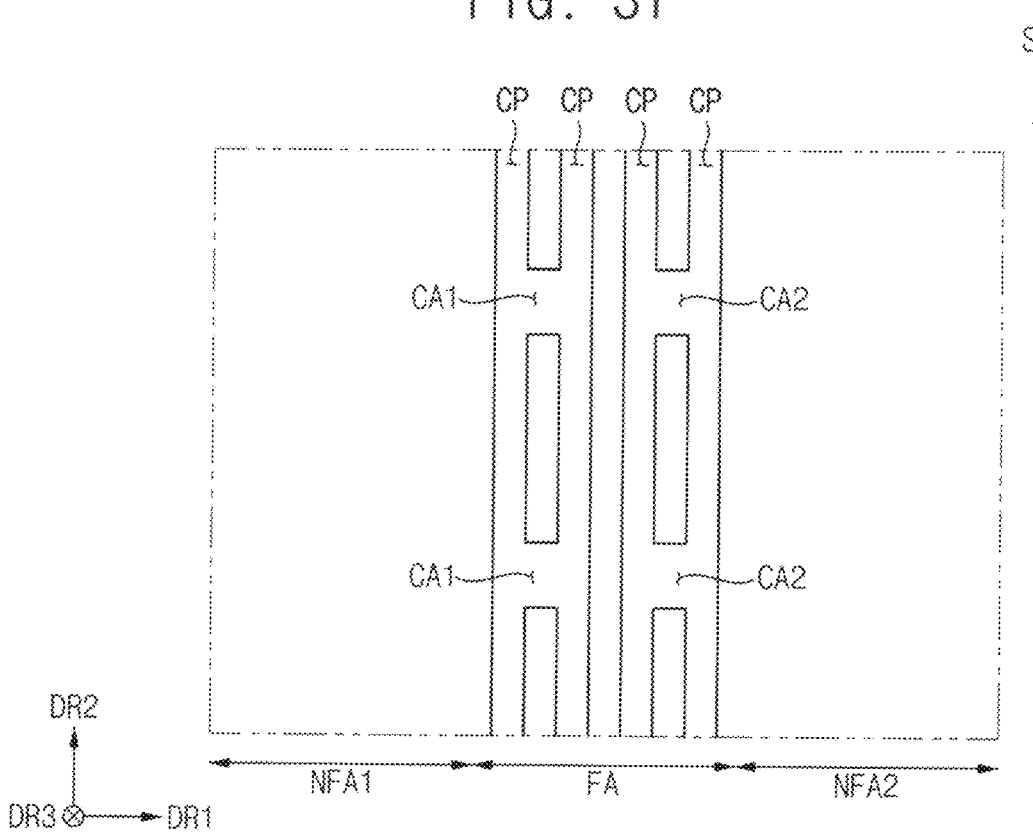

FIG. 31 is a diagram illustrating that a plurality of first connection areas CA1 and a plurality of second connection areas CA2 are formed together with each other. The first connection area CA1 and the second connection area CA2 are disposed on a same imaginary line extending in the first direction DR1.

Figure 32:
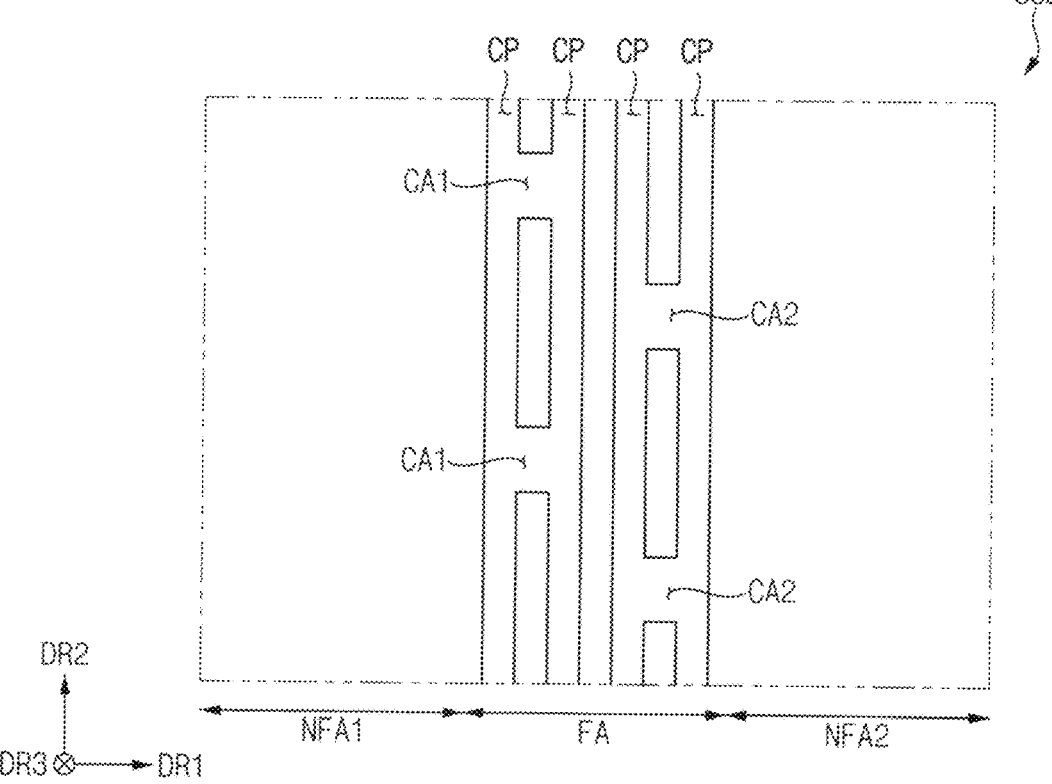

FIG. 32 is a diagram illustrating that a plurality of first connection areas CA1 and a plurality of second connection areas CA2 are formed together with each other. The first connection area CA1 and the second connection area CA2 are located at different positions (or different virtual lines) along the second direction DR2.

Figure 33:
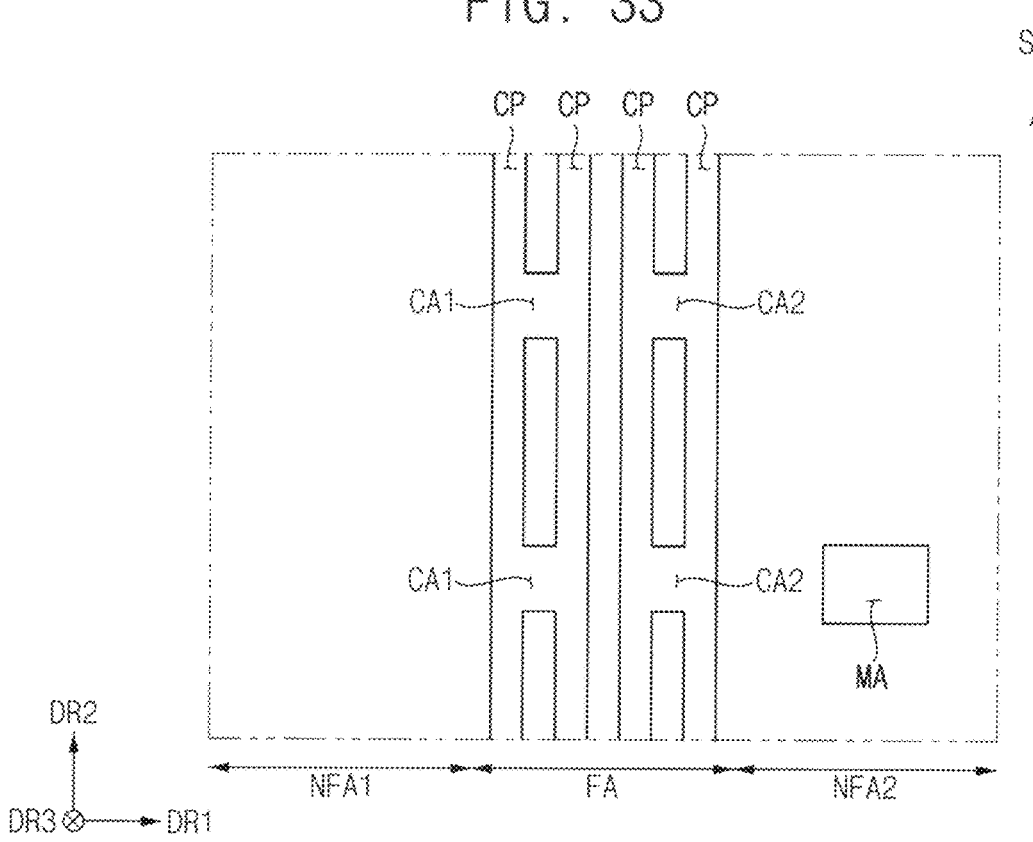
Figure 34:
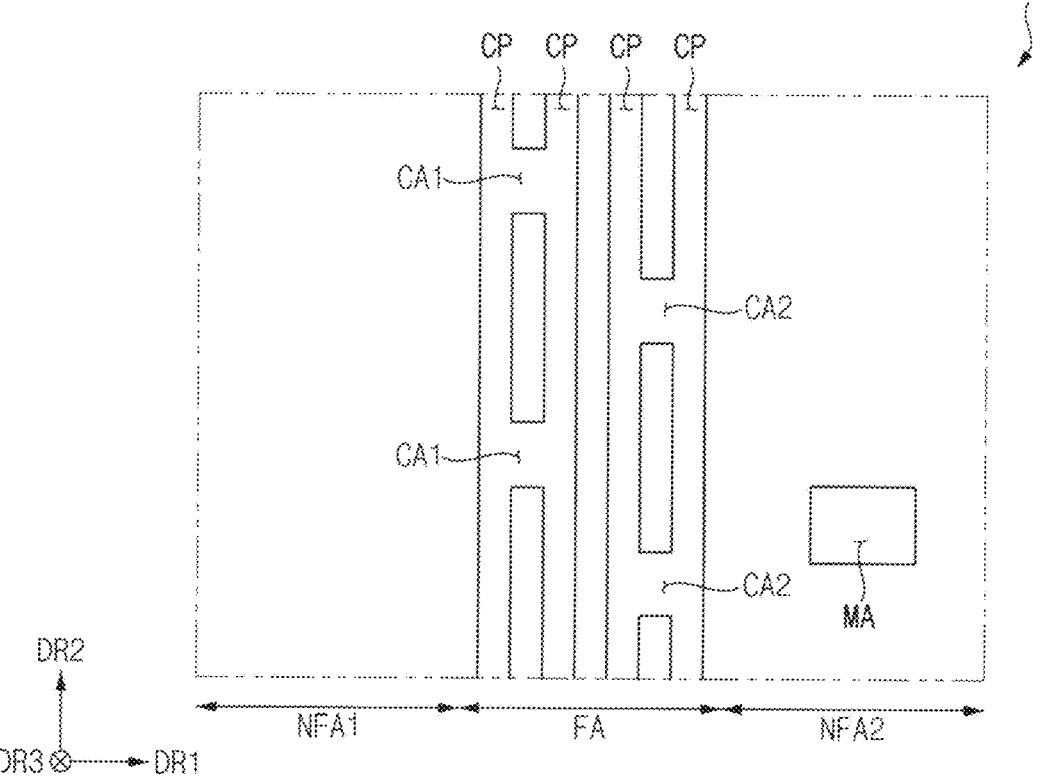

FIG. 33 is substantially the same as FIG. 31 except that the measuring area MA is added, and FIG. 34 is substantially the same as FIG. 32 except that a measuring area MA is added.

Although, the number of the plurality of concave portions CP is illustrated as four in the above figures, the number of the plurality of concave portions CP may be N (where N is a natural number equal to or greater than 2).

In addition, the embodiments described with reference to FIG. 20 to FIG. 34 may further include a protective layer PL disposed under the substrate SUB, that is, in a direction opposite to the third direction DR3 shown in the drawings. The protective layer PL may be substantially the same as the protective layer PL described with reference to FIG. 4 to FIG. 19. In an embodiment, the substrate SUB together with the protective layer PL may be considered a support layer to the other layers of the display panel DP. For example, a driving part and a light emitting element of a which is connected to the driving part (e.g., a display element layer), may be on a first surface of a support layer (substrate SUB+protective layer PL). The support layer may include a first sub-support layer (e.g., the substrate SUB) and a second sub-support layer (e.g., the protective layer PL), where each of the sub-support layers includes a first surface closest to the display element layer, a second surface opposite to the first surface, and a plurality of concave portions recessed from the second surface. The third direction DR3 may be a light emitting direction of the display element layer, and the support layer may be on the display element layer in a direction opposite to the light emitting direction.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A foldable display device comprising:

a display panel which emits light toward a first surface of the display panel, the display panel comprising a folding area and a non-folding area which is adjacent to the folding area along a first direction; and a protective layer on a second surface opposite to the first surface, the protective layer facing the folding area of the display panel and defining a plurality of concave portions corresponding to the folding area, wherein each of the plurality of concave portions extends along a second direction crossing the first direction, and concave portions adjacent to each other along the first direction among the plurality of concave portions, are connected to each other along the first direction.

2. The foldable display device of claim 1, wherein within the protective layer:

each of the plurality of concave portions has a first width along the first direction, the concave portions adjacent to each other along the first direction are connected to each other at a connection area of the protective layer, the protective layer has a first thickness adjacent to the plurality of concave portions and adjacent to the connection area, the protective layer has a second thickness corresponding to the plurality of concave portions and to the connection area, wherein the second thickness is smaller than the first thickness, the connection area has a second width along the first direction and a third width along the second direction, and each of the second width and the third width of the connection area is larger than the first width of the plurality of concave portions.

3. The foldable display device of claim 2, wherein within the protective layer:

the connection area is provided in plural including a plurality of connection areas, among the concave portions adjacent to each other along the first direction:

first concave portions are connected to each other at a first connection area of the protective layer, and second concave portions are connected to each other at a second connection area of the protective layer, and the first connection area and the second connection area are aligned along the first direction.

4. The foldable display device of claim 2, wherein within the protective layer:

the connection area is provided in plural including a plurality of connection areas, among the concave portions adjacent to each other along the first direction:

first concave portions are connected to each other at a first connection area of the protective layer, and second concave portions are connected to each other at a second connection area of the protective layer, and the first connection area and the second connection area are spaced apart from each other along the second direction.

5. The foldable display device of claim 2, wherein the protective layer further defines an additional concave portion corresponding to the non-folding area, the protective layer has the second thickness at the additional concave portion, the additional concave portion has a fourth width along the first direction and a fifth width along the second direction, and each of the fourth width and the fifth width of the additional concave portion is larger than the first width of the plurality of concave portions.

6. The foldable display device of claim 5, wherein within the protective layer:

the connection area is provided in plural including a plurality of connection areas, among the concave portions adjacent to each other along the first direction:

first concave portions are connected to each other at a first connection area of the protective layer, and second concave portions are connected to each other at a second connection area of the protective layer, and the first connection area and the second connection area are aligned along the first direction.

7. The foldable display device of claim 5, wherein within the protective layer:

the connection area is provided in plural including a plurality of connection areas, among the concave portions adjacent to each other along the first direction:

first concave portions are connected to each other at a first connection area of the protective layer, and second concave portions are connected to each other at a second connection area of the protective layer, and the first connection area and the second connection area are spaced apart from each other along the second direction.

8. The foldable display device of claim 1, wherein the protective layer comprises metal.

9. A foldable display device comprising:

a display panel which emits light toward a first surface of the display panel, the display panel comprising a folding area and a non-folding area which is adjacent to the folding area along a first direction; and a protective layer on a second surface opposite to the first surface, the protective layer facing the folding area of the display panel;

a plurality of concave portions defined in the protective layer, the plurality of concave portions including:

a first concave portion extending in a second direction crossing the first direction, at the folding area; and a second concave portion at the non-folding area, wherein the protective layer has a first thickness adjacent to the first concave portion and the second concave portion, and the protective layer has a second thickness corresponding to the first concave portion and the second concave portion, wherein the second thickness is smaller than the first thickness.

10. The foldable display device of claim 9, wherein among the plurality of concave portions defined in the protective layer:

the first concave portion has a first width along the first direction, and the second concave portion has a second width along the first direction and a third width along the second direction, the second width and the third width being larger than the first width of the first concave portion.

11. A foldable display device, comprising:

a substrate comprising a folding area, a non-folding area which is adjacent to the folding area along a first direction, a first surface and a second surface which is opposite to the first surface;

a driving part and a light emitting element which is connected to the driving part, on the second surface of the substrate; and the substrate defining a plurality of first concave portions recessed from the first surface of the substrate, in the folding area, wherein each of the plurality of first concave portions extends in a second direction perpendicular to the first direction, each of the plurality of first concave portions has a first width along the first direction, and first concave portions adjacent to each other along the first direction among the plurality of first concave portions, are connected each other along the first direction.

12. The foldable display device of claim 11, wherein within the substrate:

the first concave portions adjacent to each other along the first direction are connected to each other at a connection area of the substrate, the substrate has a first thickness adjacent to the plurality of first concave portions and adjacent to the connection area, the substrate has a second thickness corresponding to the plurality of first concave portions and to the connection area, wherein the second thickness is smaller than the first thickness, the connection area has a second width along the first direction and a third width along the second direction, and each of the second width of and the third width is larger than the first width of the plurality of first concave portions.

13. The foldable display device of claim 12, wherein within the substrate:

the connection area is provided in plural including a plurality of connection areas, among the first concave portions adjacent to each other along the first direction:

a first group of concave portions are connected to each other at a first connection area of the substrate, and a second group of concave portions are connected to each other at a second connection area of the substrate, and the first connection area and the second connection area are aligned along the first direction.

14. The foldable display device of claim 12, wherein within the substrate:

the connection area is provided in plural including a plurality of connection areas, among the first concave portions adjacent to each other along the first direction:

a first group of concave portions are connected to each other at a first connection area of the substrate, and a second group of concave portions are connected to each other at a second connection area of the substrate, and the first connection area and the second connection area are spaced apart from each other along the second direction.

15. The foldable display device of claim 12, wherein the substrate further defines a measuring concave portion recessed from the first surface of the substrate, in the non-folding area, the substrate has the second thickness at the measuring concave portion, the measuring concave portion has a fourth width along the first direction and a fifth width along the second direction, and each of the fourth width and the fifth width of the measuring concave portion is larger than the first width of the plurality of first concave portions.

16. The foldable display device of claim 15, wherein within the substrate:

the connection area is provided in plural including a plurality of connection areas, among the first concave portions adjacent to each other along the first direction:

a first group of concave portions are connected to each other at a first connection area of the substrate, and a second group of concave portions are connected to each other at a second connection area of the substrate, and the first connection area and the second connection area are aligned along the first direction.

17. The foldable display device of claim 15, wherein within the substrate:

the connection area is provided in plural including a plurality of connection areas, among the first concave portions adjacent to each other along the first direction:

a first group of concave portions are connected to each other at a first connection area of the substrate, and a second group of concave portions are connected to each other at a second connection area of the substrate, and the first connection area and the second connection area are spaced apart from each other along the second direction.

18. The foldable display device of claim 11, wherein the substrate comprises glass.

19. The foldable display device of claim 12, further comprising a protective layer on the first surface of the substrate, the protective layer defining a plurality of second concave portions corresponding to the folding area of the substrate, the plurality of second concave portion extending along the second direction.

20. The foldable display device of claim 19, wherein the protective layer has a third thickness adjacent to the plurality of second concave portions, and the protective layer has a fourth thickness corresponding to the plurality of second concave portions, wherein the fourth thickness is smaller than the third thickness.

21. The foldable display device of claim 20, wherein second concave portions adjacent to each other along the first direction among the plurality of second concave portions, are connected each other along the first direction, at a connection area, and the protective layer has the fourth thickness corresponding to the connection area.

22. The foldable display device of claim 21, wherein within the protective layer:

the connection area is provided in plural including a plurality of connection areas, among the second concave portions adjacent to each other along the first direction:

a first group of concave portions are connected to each other at a first connection area of the substrate, and a second group of concave portions are connected to each other at a second connection area of the substrate, and the first connection area and the second connection area are aligned along the first direction.

23. The foldable display device of claim 21, wherein within the protective layer:

the connection area is provided in plural including a plurality of connection areas, among the second concave portions adjacent to each other along the first direction:

a first group of concave portions are connected to each other at a first connection area of the substrate, and a second group of concave portions are connected to each other at a second connection area of the substrate, and the first connection area and the second connection area are spaced apart from each other along the second.

24. The foldable display device of claim 20, wherein the protective layer further defines a measuring concave portion corresponding to the non-folding area, and the protective layer has the fourth thickness at the measuring concave portion.

25. The foldable display device of claim 19, wherein the protective layer comprises metal.

* * * * *